United States Patent
Okumura et al.

(10) Patent No.: US 8,703,613 B2
(45) Date of Patent: Apr. 22, 2014

(54) PLASMA PROCESSING APPARATUS AND PLASMA PROCESSING METHOD

(75) Inventors: Tomohiro Okumura, Osaka (JP); Ichiro Nakayama, Osaka (JP); Mitsuo Saitoh, Osaka (JP)

(73) Assignee: Panasonic Corporation, Osaka (JP)

( * ) Notice: Subject to any disclaimer, the term of this patent is extended or adjusted under 35 U.S.C. 154(b) by 70 days.

(21) Appl. No.: 13/582,557

(22) PCT Filed: May 11, 2011

(86) PCT No.: PCT/JP2011/002609
§ 371 (c)(1),
(2), (4) Date: Sep. 4, 2012

(87) PCT Pub. No.: WO2011/142125
PCT Pub. Date: Nov. 17, 2011

(65) Prior Publication Data
US 2012/0325777 A1   Dec. 27, 2012

(30) Foreign Application Priority Data

May 13, 2010  (JP) .................................. 2010-110743
Sep. 2, 2010  (JP) .................................. 2010-196387
Feb. 25, 2011  (JP) .................................. 2011-039787

(51) Int. Cl.
*H01L 21/44* (2006.01)
*H01L 27/14* (2006.01)

(52) U.S. Cl.
USPC .......................................... 438/680; 257/428

(58) Field of Classification Search
USPC ...................... 438/59–63, 680; 257/428, 607, 257/E31.001–E31.131; 118/723 E, 725
See application file for complete search history.

(56) References Cited

U.S. PATENT DOCUMENTS

| 5,093,207 A | 3/1992 | Hodes et al. |
| 6,262,386 B1 | 7/2001 | Förnsel |

(Continued)

FOREIGN PATENT DOCUMENTS

| JP | 2-504046 | 11/1990 |
| JP | 4-284974 | 10/1992 |

(Continued)

OTHER PUBLICATIONS

English translation of International Preliminary Report on Patentability issued Dec. 10, 2012 in International (PCT) Application No. PCT/JP2011/002609.

(Continued)

*Primary Examiner* — Calvin Lee
(74) *Attorney, Agent, or Firm* — Wenderoth, Lind & Ponack, L.L.P.

(57) ABSTRACT

A base material is placed on a base material placement face of a base material placement table. An inductively coupled plasma torch unit is structured with a cylindrical chamber structured with a cylinder made of an insulating material and provided with a rectangular slit-like plasma jet port, and lids closing opposing ends of the cylinder, a gas jet port that supplies gas into the cylindrical chamber, and a solenoid coil that generates a high frequency electromagnetic field in the cylindrical chamber. By a high frequency power supply supplying a high frequency power to the solenoid coil, plasma is generated in the cylindrical chamber, and the plasma is emitted from the plasma jet port to the base material. While relatively shifting the plasma torch unit and the base material placement table, a base material surface can be subjected to heat treatment.

13 Claims, 27 Drawing Sheets

(56) References Cited

U.S. PATENT DOCUMENTS

| | | | | |
|---|---|---|---|---|
| 8,450,819 | B2 * | 5/2013 | Okumura et al. | 257/428 |
| 2006/0254521 | A1 | 11/2006 | Mai et al. | |
| 2012/0058649 | A1 * | 3/2012 | Okumura et al. | 438/798 |

FOREIGN PATENT DOCUMENTS

| | | |
|---|---|---|
| JP | 8-118027 | 5/1996 |
| JP | 2001-68298 | 3/2001 |
| JP | 2002-500818 | 1/2002 |
| JP | 2003-109799 | 4/2003 |
| JP | 2004-296729 | 10/2004 |
| JP | 2006-60130 | 3/2006 |
| JP | 2007-505451 | 3/2007 |
| JP | 2007-287454 | 11/2007 |
| JP | 2008-53634 | 3/2008 |
| JP | 2009-545165 | 12/2009 |
| WO | 99/52333 | 10/1999 |
| WO | 2008/013942 | 1/2008 |

OTHER PUBLICATIONS

International Search Report issued Aug. 9, 2011 in International (PCT) Application No. PCT/JP2011/002609.

Seiichiro Higashi et al., "Crystallization of Si in Millisecond Time Domain Induced by Thermal Plasma Jet Irradiation", Japanese Journal of Applied Physics, vol. 45, No. 5B, pp. 4313-4320, 2006.

Yasunori Tanaka et al., "Non-Equilibria in Thermal Plasmas", Journal of Plasma and Fusion Research, vol. 82, No. 8, pp. 479-483, 2006.

* cited by examiner

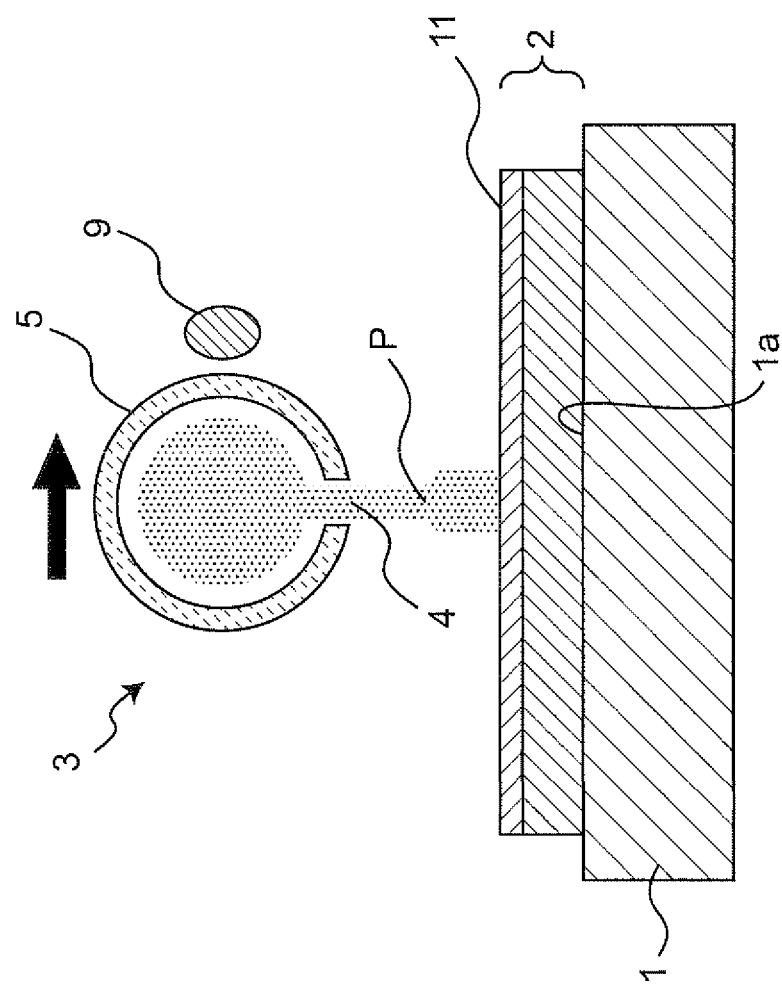

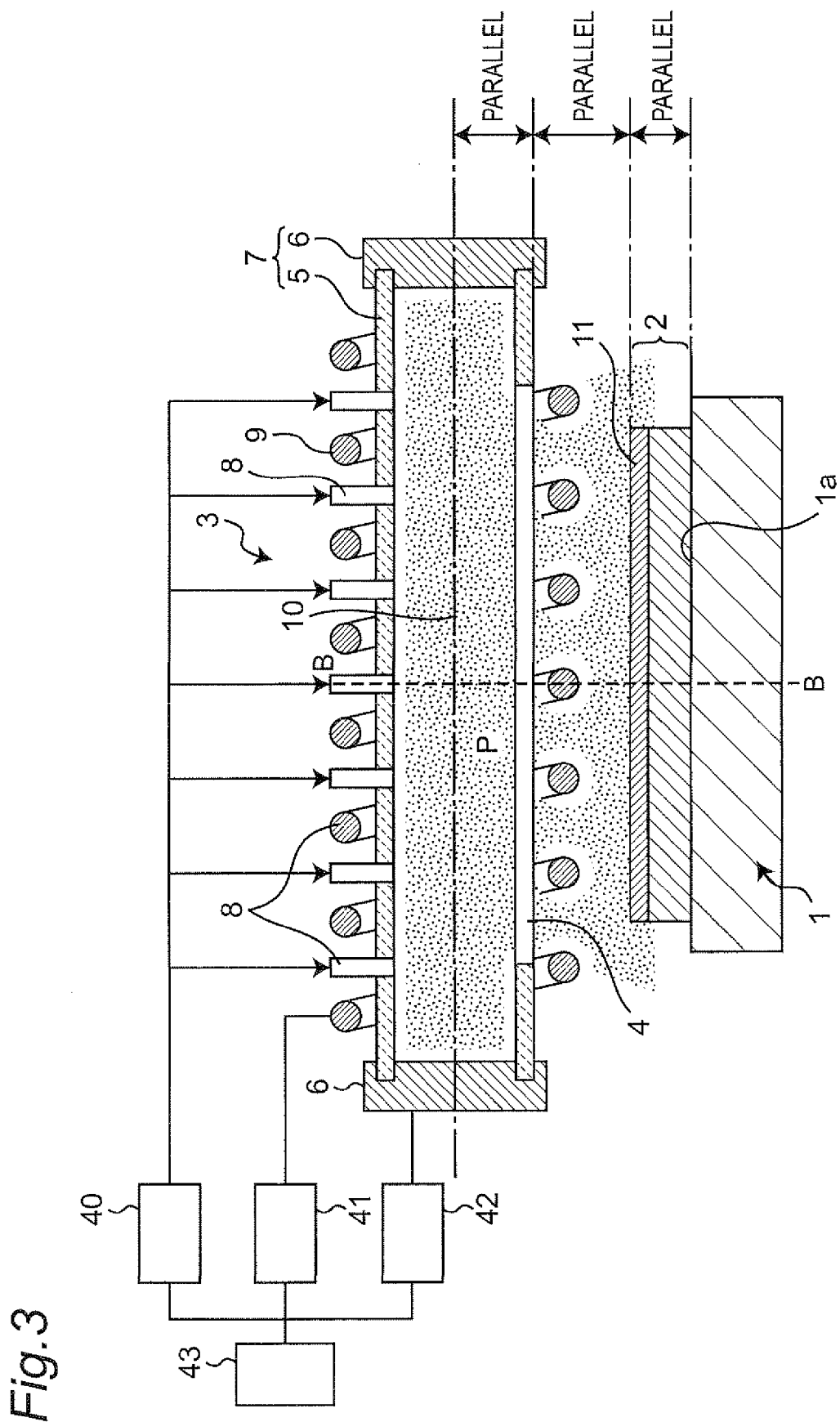

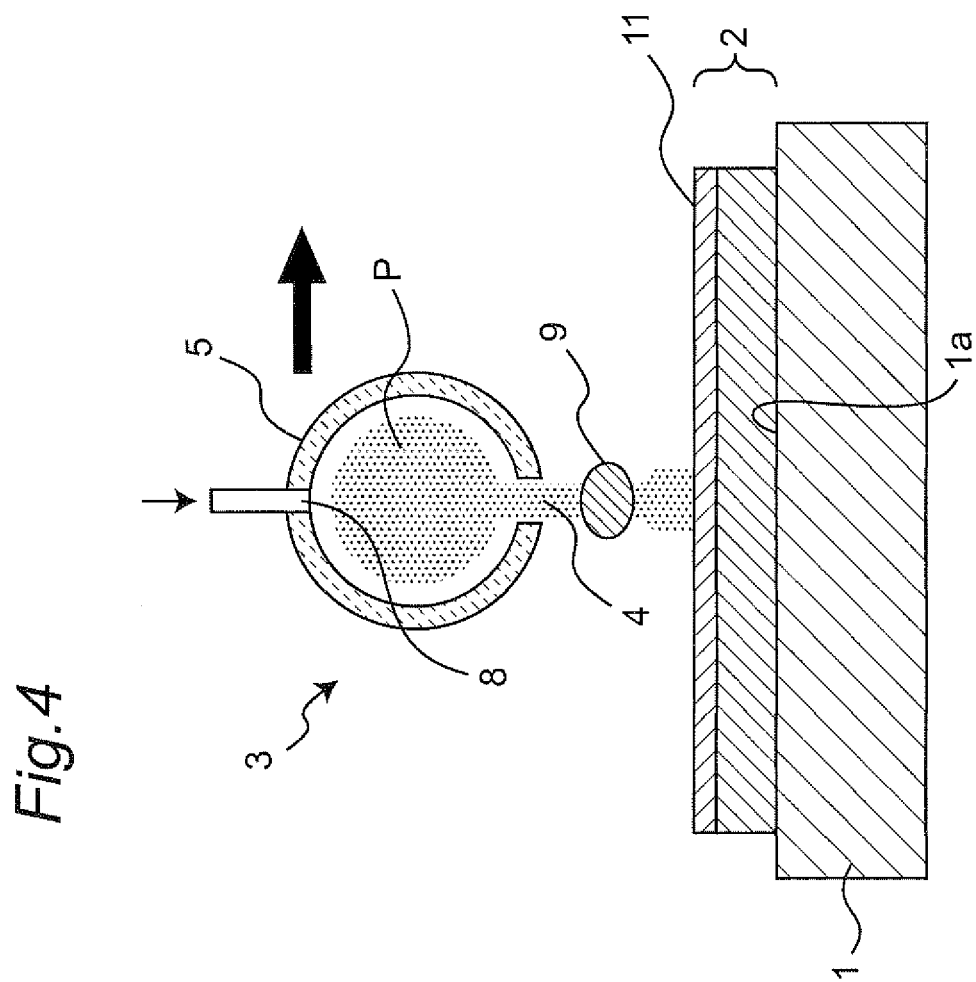

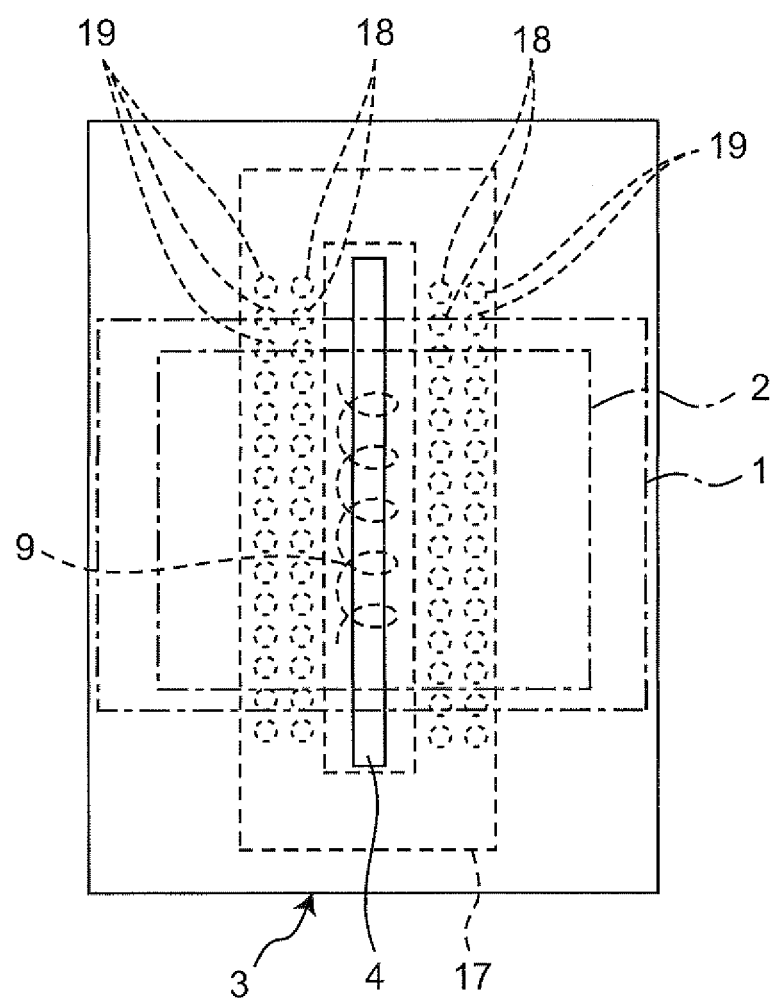

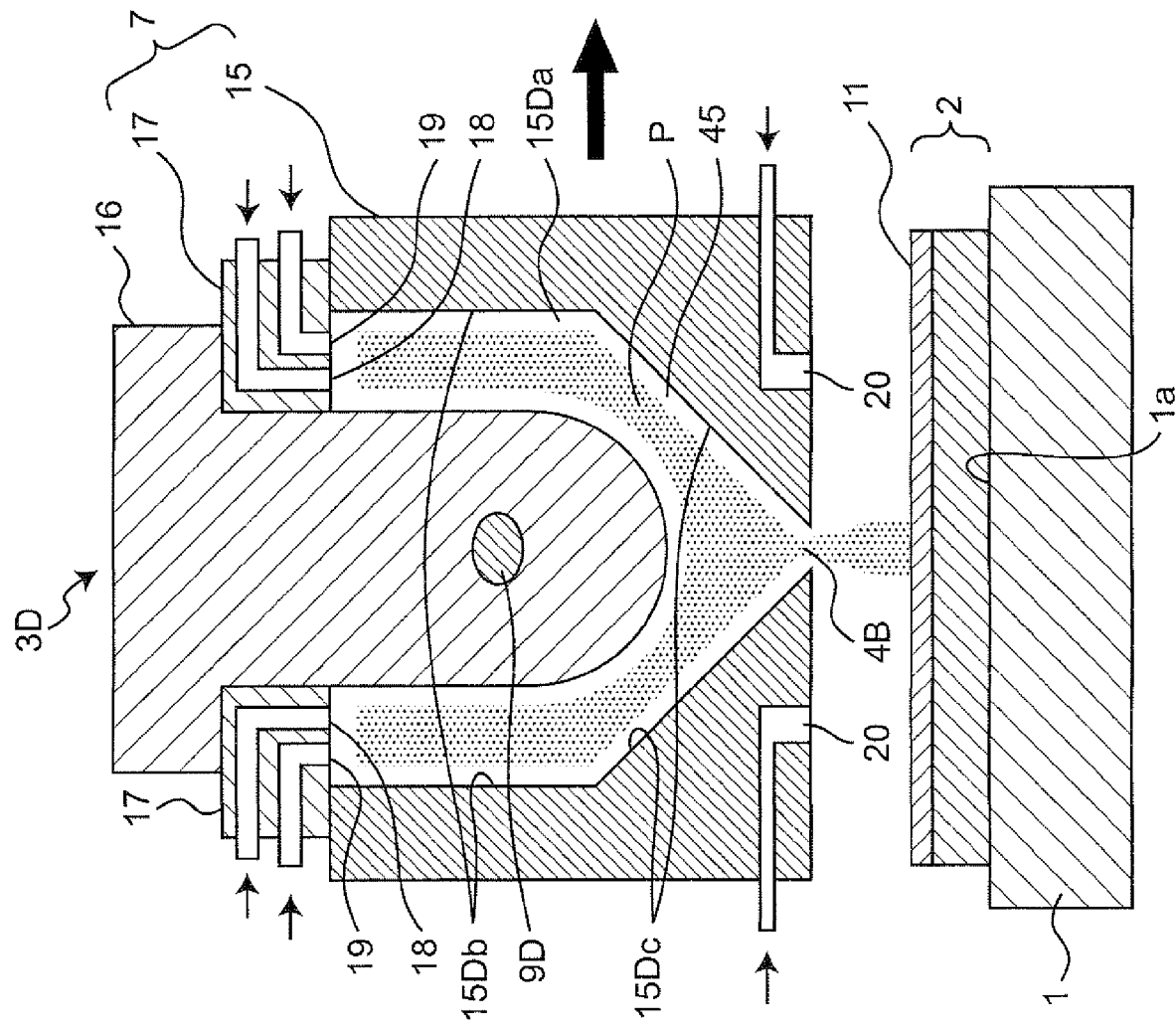

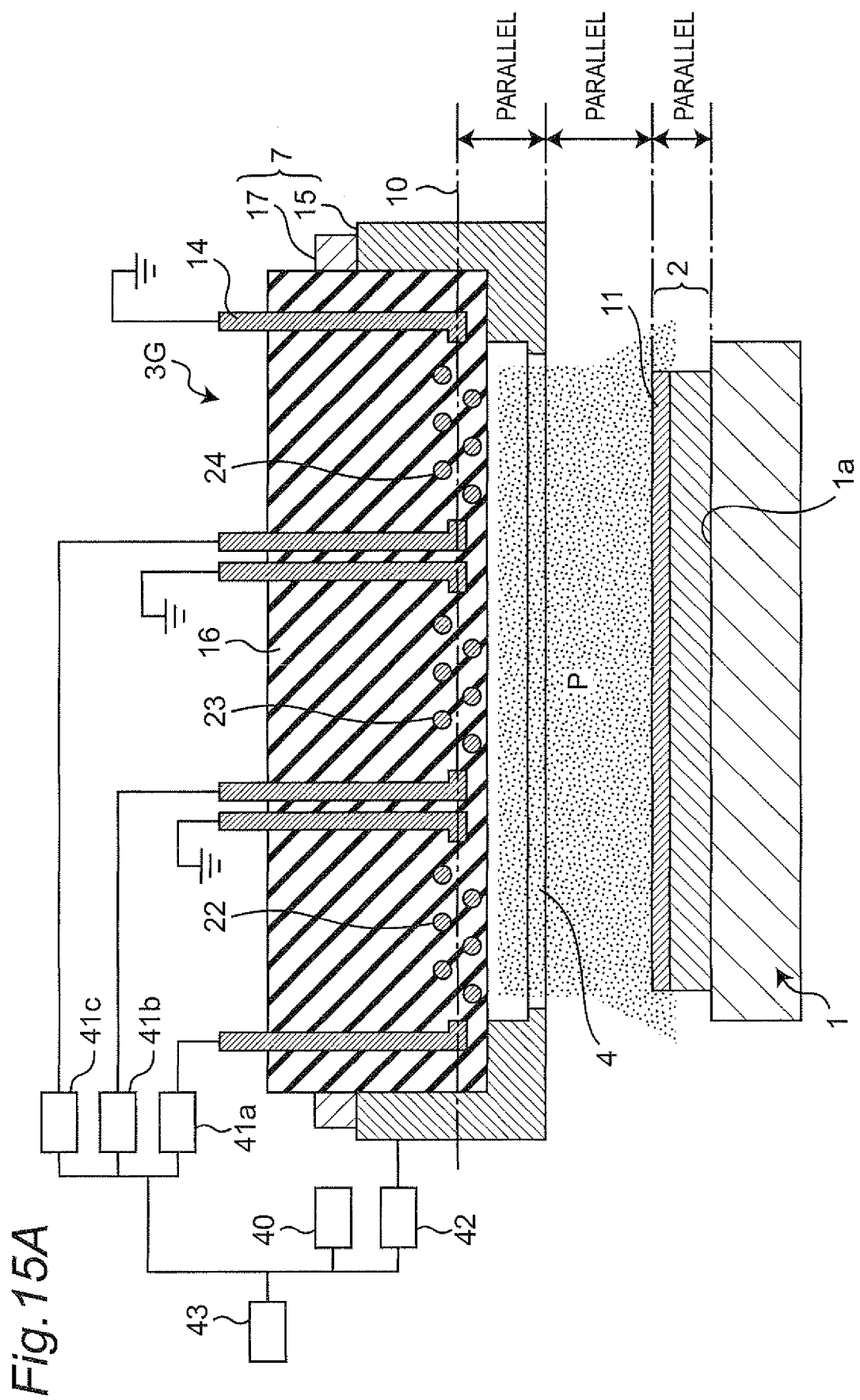

Fig.15B
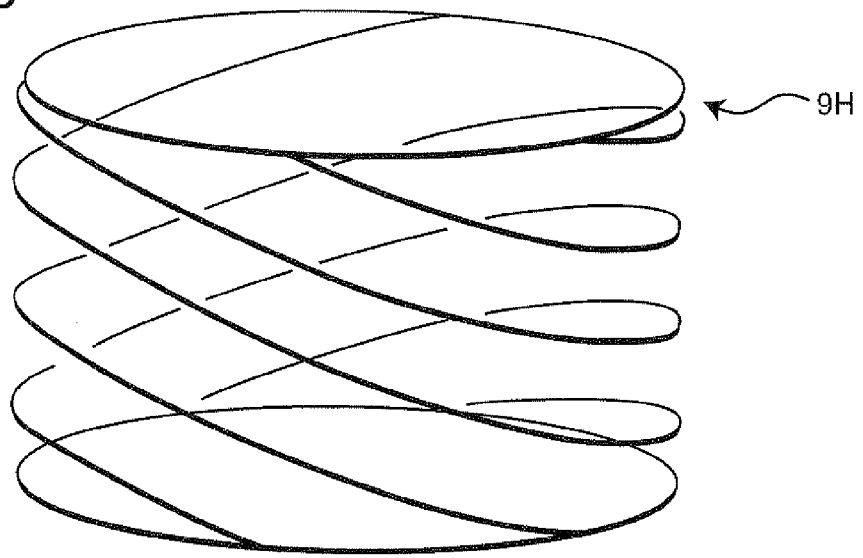
Fig.16
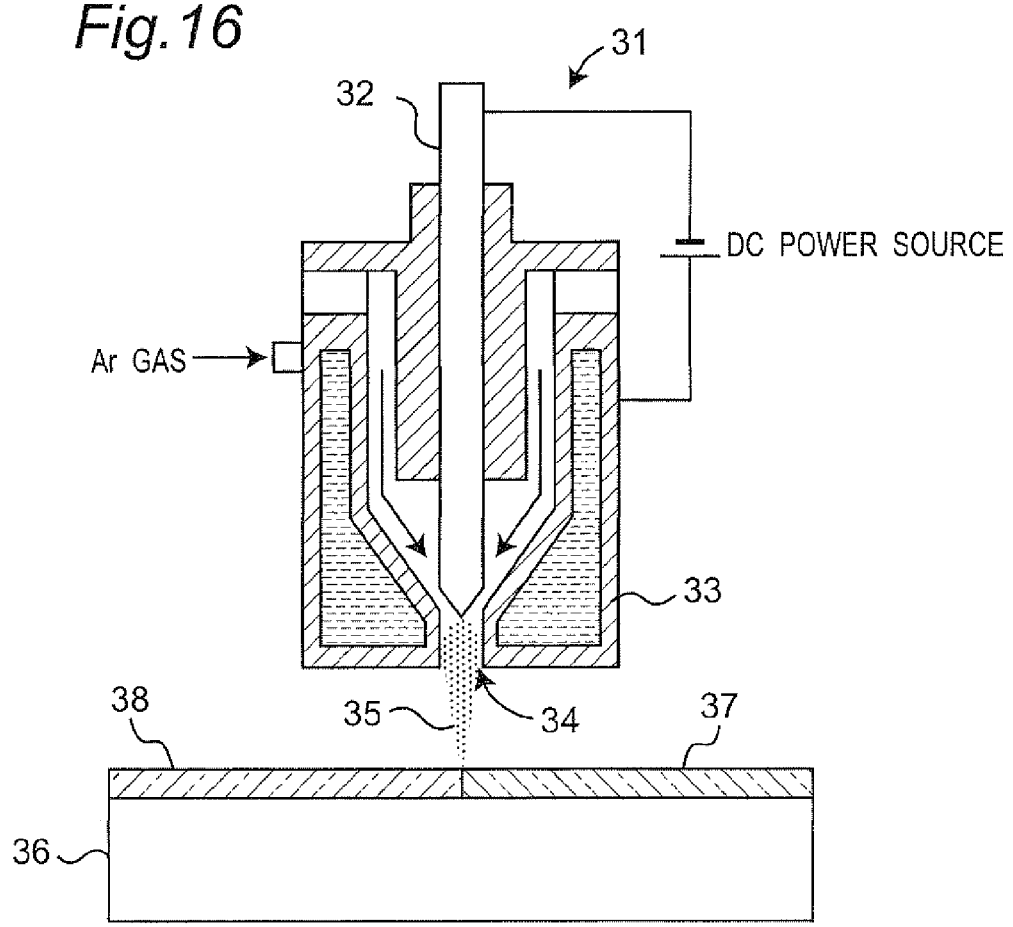
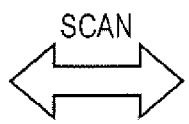

PLASMA PROCESSING APPARATUS AND PLASMA PROCESSING METHOD

TECHNICAL FIELD

The present invention relates to a plasma processing apparatus and a plasma processing method, for performing plasma processing such as thermal plasma processing in which thermal plasma is emitted to a base material to process the base material, or low-temperature plasma processing in which plasma of a reactant gas is emitted or plasma and a reactant gas flow are simultaneously emitted to a base material to process the base material.

BACKGROUND ART

Conventionally, a semiconductor thin film such as polycrystalline silicon (poly-Si) is widely used for thin film transistors (TFTs: Thin Film Transistors) or solar cells. In particular, poly-SiTFTs are characterized by their high carrier mobility, and capability of being prepared on a transparent insulating substrate such as a glass substrate. Taking advantage of such characteristics, the poly-SiTFTs are widely used, e.g., as a switching element that structures a pixel circuit such as a liquid crystal display apparatus, a liquid crystal projector, or an organic EL display apparatus; or as a circuit element of a driver for liquid crystal drive.

One of the methods for preparing high-performance TFTs on a glass substrate is a manufacturing method generally referred to as the "high-temperature process". Among the TFT manufacturing processes, the process that uses high temperatures, in which the maximum temperature during the processing steps is approximately 1000° C., is generally referred to as the "high-temperature process". The characteristics of the high-temperature process lies in that: polycrystalline silicon of relatively high quality can be deposited through solid phase epitaxy of silicon; a high quality gate insulating layer can be obtained through thermal oxidation of silicon; and an interface between clean polycrystalline silicon and the gate insulating layer can be formed. With the high-temperature process, thanks to those characteristics, high-performance TFTs with high mobility and high reliability can stably be manufactured.

On the other hand, since the high-temperature process is the process of performing crystallization of a silicon film through solid phase epitaxy, heat treatment under a temperature of approximately 600° C. for a long time of approximately 48 hours is required. This is an enormously long step, and involves the issue that it essentially requires great number of heat treat furnaces in order to improve the throughput of the step, which makes it difficult to achieve a reduction in costs. In addition, since it is inevitable to use silica glass as the insulating substrate which is highly heat resistant, the cost of the substrate is high. Therefore, it is regarded that it is not suitable for increasing the area.

On the other hand, the technique for reducing the maximum temperature during the step to prepare poly-SiTFTs on a cost-effective and large-area glass substrate is the technique referred to as the "low-temperature process". Among the TFT manufacturing processes, the process of manufacturing poly-SiTFTs on a relatively cost-effective heat-resistant glass substrate in the temperature environment in which the maximum temperature is approximately 600° C. or less is generally referred to as the "low-temperature process". What is widely used in the low-temperature process is the laser crystallization technique in which crystallization of a silicon film is performed using a pulsed laser whose oscillation time is very short. The laser crystallization is the technique that exploits the nature of a molten silicon thin film crystallizing in the process of solidifying, after high output pulsed laser light is emitted to the silicon thin film on a substrate to instantaneously melt the silicon thin film.

However, the laser crystallization technique involves several significant issues. One of them is a large amount of trap levels locally present inside a polysilicon film formed through the laser crystallization technique. Because of the presence of the trap levels, the carriers that should originally move in the active layer by application of voltage are trapped and cannot contribute to electrical conduction. This has disadvantageous effects such as a reduction in mobility of TFTs and an increase in the threshold voltage. Another issue is that the limitation on the laser output limits the size of the glass substrate. In order to improve the throughput of the laser crystallization step, it is necessary to increase the area that can be crystallized at once. However, since the current laser output is limited, in the case where the crystallization technique is adopted for a large-size substrate, e.g., of the seventh generation (1800 mm×2100 mm), it requires a long time to crystallize a piece of substrate.

Further, in the laser crystallization technique, generally a linearly shaped laser is used. Scanning the laser, crystallization is achieved. Since the linear beam is limited in terms of laser output, it is shorter than the width of the substrate. Therefore, in order to allow the entire surface of the substrate to be crystallized, the scanning by the laser must be performed for several times. This results in the juncture region of the linear beams in the substrate, which is scanned twice. This region is largely different in crystallinity from the region where the crystallization is achieved by one-time scanning. Therefore, the element characteristic largely differs between the regions. This becomes a major factor of variations among the devices. Finally, since the laser crystallization apparatus has complicated device structure and the cost of the consumable parts is high, there is an issue that the apparatus cost and the running cost are high. Thus, the TFTs using a polysilicon film crystallized by the laser crystallization apparatus become the elements whose manufacturing cost is high.

In order to remove the issues such as the limitation on the size of the substrate and the high apparatus cost, the crystallization technique referred to as the "thermal plasma thermal jet crystallization method" is studied (e.g., see Non-patent Literature 1). This technique is briefly described in the following. When a tungsten (W) cathode and a water-cooled copper (Cu) anode are opposed to each other and a DC voltage is applied, arc discharge occurs between the electrodes. By allowing the argon gas to flow between the electrodes under the atmospheric pressure, thermal plasma is jetted out from the jet hole opening at the copper anode. The thermal plasma is thermal equilibrium plasma, which is an ultrahigh temperature heat source in which the temperatures of ions, electrons, and neutral atoms are substantially equal to one another, each being approximately 10000 K. Therefore, the thermal plasma can easily heat any heating target object to high temperatures. By the substrate on which an a-Si film is deposited being scanned at high speed on the thermal plasma front surface of the ultrahigh temperature, the a-Si film can be crystallized.

As described above, since the device structure is very simple and what is performed is the crystallization process under the atmospheric pressure, it is not necessary to cover the apparatus by an expensive member such as a chamber, and an extremely low apparatus cost can be expected. Further, since the utility required for crystallization is argon gas, electric power, and cooling water, it is the cost-effective crystallization technique in terms of the running cost also.

FIG. 16 is a schematic view for describing a semiconductor film crystallization method which uses this thermal plasma.

In FIG. 16, a thermal plasma generating apparatus 31 is structured to include a cathode 32, and an anode 33 disposed to be opposed to the cathode 32 by a prescribed distance. The cathode 32 is made of a conductor such as tungsten, for example. The anode 33 is made of a conductor such as copper, for example. Further, the anode 33 is formed to be hollow, such that water is allowed to pass through the hollow portion for cooling. Further, the anode 33 is provided with a jet hole (nozzle) 34. When a direct current (DC) voltage is applied between the cathode 32 and the anode 33, arc discharge is generated between the opposite electrodes. In this state, by allowing gas such as argon gas to flow between the cathode 32 and the anode 33 under the atmospheric pressure, the thermal plasma 35 can be jetted out from the jet hole 34. Here, the "thermal plasma" is the thermal equilibrium plasma, which is an ultrahigh temperature heat source in which temperatures of ions, electrons, and neutral atoms are substantially equal to one another, each being approximately 10000 K.

Such thermal plasma can be used for heat treatment for crystallization of a semiconductor film. Specifically, a semiconductor film 37 (e.g., an amorphous silicon film) is previously formed on a substrate 36, and thermal plasma (thermal plasma jet) 35 is blown in the semiconductor film 37. At this time, the thermal plasma 35 is blown in the semiconductor film 37 while being relatively shifted along the first axis (the right-left direction in the example shown in the figure) which is parallel to the surface of the semiconductor film 37. That is, the thermal plasma 35 is blown in the semiconductor film 37 while scanning in the first axis direction. As used herein, "to relatively shift" refers to relatively shift the semiconductor film 37 (and the substrate 23 supporting the same) and the thermal plasma 35, and includes both the case where only one of them is shifted and both of them are shifted. Such scanning of the thermal plasma 35 heats the semiconductor film 37 by high temperatures of the thermal plasma 35, to provide a crystallized semiconductor film 38 (a polysilicon film in the present example) (e.g., see Patent Literature 1).

FIG. 17 is a conceptual view that shows the relationship between the depth from the topmost surface and the temperature. As shown in FIG. 17, by shifting the thermal plasma 35 at a high speed on the substrate 36, only the proximity of the surface of the substrate 36 can be processed at high temperatures. After the thermal plasma 35 has passed, the heated region is quickly cooled and, therefore, the proximity of the surface achieves high temperature just for a short time.

Generally, such thermal plasma is generated at a dot-like region. The thermal plasma is maintained by thermionic emission from the cathode 32. Since the thermionic emission becomes more active at the position where the plasma density is high, the positive feedback is obtained, and the plasma density becomes even higher. That is, arc discharge occurs as being focused on one point of the cathode, and hence the thermal plasma is generated at the dot-like region.

In the case where a plate-like base material is desired to be processed evenly, such as crystallization of a semiconductor film, it is necessary to scan the dot-like thermal plasma over the entire base material. On the other hand, for the purpose of structuring the process with which the base material can be processed with reduced number of times of performing scanning and reduced time, it is effective to widen the emission area of the thermal plasma. Therefore, techniques for generating thermal plasma over a large area have long been considered.

For example, what is disclosed is a method for widening a plasma jet, in which width-widening gas for widening the width of the plasma jet is jetted simultaneously from each of two places in the direction crossing the center axis of the external nozzle to a plasma jet being jetted out from the external nozzle of the plasma torch (e.g., see Patent Literature 2). Alternatively, there is a disclosure of a method in which a plasma nozzle is provided, the plasma nozzle being characterized in that the opening portion of a nozzle passage is tilted by a prescribed angle relative to the axial center of the nozzle passage. A casing structuring the nozzle passage, or a part of the casing is rotated at a high speed about the longitudinal axial core, and the plasma nozzle is shifted to pass along a workpiece (e.g., see Patent Literature 3). Further, there is a disclosure in which a rotary head having at least one eccentrically arranged plasma nozzle is provided (e.g., see Patent Literature 4).

It is to be noted that, though it is not directed to process a large area in a short time, as a welding method using thermal plasma, a high-speed gas shielded arc welding is disclosed. The method is characterized in that a band-like electrode is used, and welding is carried out such that the width direction of the electrode is aligned with the welding line direction (e.g., see Patent Literature 5).

Further, there is a disclosure of an inductively coupled plasma torch forming a linear elongated shape, which employs a flat rectangular parallelepiped-shaped insulating material (e.g., see Patent Literature 6).

It is to be noted that, there is a disclosure of a method of generating elongated linear plasma using an elongated electrode (e.g., see Patent Literature 7). Though it is described that it generates thermal plasma, it generates low-temperature plasma and is not suitably structured for heat treatment. Provided that thermal plasma is generated, since it is the capacitive coupling type using an electrode, it is considered that arc discharge would be focused on one place to make it difficult to generate thermal plasma being uniform in the longer direction. On the other hand, as a low-temperature plasma processing apparatus, it is an apparatus that is capable of performing plasma processing such as etching or deposition by turning etching gas or CVD (Chemical Vapor Deposition)-use gas into plasma.

CITATION LIST

Patent Literature

Patent Literature 1: Japanese Unexamined Patent Publication No. 2008-53634
Patent Literature 2 Japanese Unexamined Patent Publication No. 08-118027
Patent Literature 3: Japanese Unexamined Patent Publication No. 2001-68298
Patent Literature 4: Japanese Unexamined Patent Publication (Translation of PCT Application) No. 2002-500818
Patent Literature 5: Japanese Unexamined Patent Publication No. 04-284974
Patent Literature 6: Japanese Unexamined Patent Publication (Translation of PCT Application) No. 2009-545165
Patent Literature 7: Japanese Unexamined Patent Publication No. 2007-287454

Non-Patent Literature

Non-Patent Literature 1: Crystallization of Si in Millisecond Time Domain Induced by Thermal Jet Irradiation" S. Higashi, H. Kaku, T. Okada, H. Murakami, and S.

Miyazaki, Japanese Journal of Applied Physics, Vol. 45, No. 5B, (2006) pp. 4313-4320

SUMMARY OF INVENTION

Technical Problem

However, the conventional techniques for generating thermal plasma in a large area are not effective in the application of processing the proximity of the surface of the base material at high temperature just for a short time, such as crystallization of a semiconductor.

As to the technique for generating thermal plasma in a large area disclosed in Patent Literature 2 as the conventional example, though it is capable of widening the width, the temperature distribution in the widened region is 100° C. or more, and uniform heat treatment cannot be realized.

Further, as to the techniques for generating thermal plasma in a large area disclosed in Patent Literature 3 and Patent Literature 4 as the conventional examples, they are essentially directed to shake the thermal plasma. Therefore, the time during which heat treatment is actually carried out is shorter than the case where scanning is performed without rotating. Hence, the time for processing a large area is not particularly shortened. Further, in order to achieve uniform processing, the rotation speed need to be fully increased as compared with the scanning speed, which inevitably complicates the structure of the nozzle.

Further, as to the technique disclosed in Patent Literature 5 as the conventional example is the welding technique, and is not the structure for uniformly processing a large area. Provided that the technique is applied to the large area processing application, the dot-like arc vibrates along the band-like electrode with this structure. Accordingly, though plasma is uniformly generated when averaged over time, non-uniform plasma is generated momentarily. Accordingly, it is not applicable to uniform processing of a large area.

Further, the technique disclosed in Patent Literature 6 as the conventional example is different from the technique employing DC arc discharge disclosed in Non-Patent Literature 1 or Patent Literature 1, and is characterized by being an inductively coupled high-frequency plasma torch. Since it is electrodeless discharge, it is advantageous in excellently stable thermal plasma (i.e., small variations over time), and less mixture (contamination) of the electrode material into the base material.

Meanwhile, in connection with the inductively coupled plasma torch, for the purpose of protecting the insulating material from the high-temperature plasma, what is generally employed is the method in which an insulating material is formed to be a double tube structure to allow coolant to flow between the tube walls. However, in the technique disclosed in Patent Literature 6 as the conventional example, since the insulating material has a flat rectangular parallelepiped-shape, the coolant of ample flow rate cannot be allowed to flow through just by applying the double tube structure thereto. The reason therefor is as follows: when the insulating material is extremely extended in the longer direction, the inner pressure of the double tube cannot be increased because the insulating material is generally poor in mechanical strength than metal. Thus, there is a limitation on the uniform large area processing.

Further, provided that there is no trouble in cooling the insulating material, in the technique disclosed in Patent Literature 6 as the conventional example, of the high-temperature plasma formed in the inner space of the insulating material, only a slight amount of plasma jetted out from the lowest portion of the insulating material directly acts on the base material. Therefore, there is an issue of poor power efficiency. Further, in the inner space of the insulating material, since the plasma density about its center becomes high, plasma becomes non-uniform in the longer direction. This poses an issue that the base material cannot be processed uniformly.

It is to be noted that, even with the dot-like thermal plasma, the number of times of performing scanning in processing a large area can be reduced when the diameter thereof is great, depending on the application. However, when the diameter of thermal plasma is great, the time during which the thermal plasma passes over the base material while scanning becomes substantially long. Thus, it is impossible to subject only the proximity of the surface of the base material to high-temperature treatment just for a short time, and a considerably deep region of the base material attains high temperatures. This may result in crack of the glass substrate or peeling off of the film.

The present invention is made in consideration of the foregoing issues, and an object thereof is to provide a plasma processing apparatus and a plasma processing method which make it possible to process the entire desired processing target region of the base material in a short time, in performing high-temperature heat treatment to the proximity of the surface of the base material uniformly just for a short time, or in subjecting the base material to low-temperature plasma processing by emitting plasma of reactant gas or plasma and a reactant gas flow simultaneously to the base material.

Solution to Problem

In order to achieve the object stated above, the present invention is structured as follows.

A plasma processing apparatus according to the present invention, is characterized by comprising:

a cylindrical chamber that is provided with a slit-like opening;

a gas supply apparatus that supplies gas into the chamber through a gas inlet port;

a solenoid coil that has a coil extending direction being parallel to a longitudinal direction of the opening and that generates a high frequency electromagnetic field in the chamber;

a high frequency power supply that supplies high frequency power to the coil;

a base material placement table that is disposed to oppose to the opening and has a base material placement face on which a base material is placed; and a shifting apparatus that relatively shifts the chamber and the base material placement table while maintaining a state in which the longitudinal direction of the opening and the base material placement face of the base material placement table are parallel to each other.

With such a structure, in subjecting the proximity of the surface of the base material to high-temperature heat treatment uniformly just for a short time, or in subjecting the base material to low-temperature plasma processing by emitting plasma of a reactant gas or both the plasma and a reactant gas flow simultaneously to the base material, the entire desired processing target region of the base material can be processed in a short time.

In the plasma processing apparatus of the present invention, the shifting apparatus may relatively shift the chamber and the base material placement table along a direction being perpendicular to the longitudinal direction of the opening. In this manner, the entire desired processing target region of the base material can be processed in a short time.

Further, in the plasma processing apparatus of the present invention, the cylindrical chamber may be structured with a cylinder made of a dielectric material, and the coil may be provided on the outer side of the chamber. Still further, in the plasma processing apparatus of the present invention, the cylindrical chamber may be structured with a cylinder made of metal, and the coil may be provided on the inner side of the chamber. In particular, in the latter case, it is advantageous in that uniformity in processing in the longitudinal direction is improved, because the structure in which the solenoid coil is not positioned between the plasma jet port and the base material placement table is obtained.

Further, in the plasma processing apparatus of the present invention, a plurality of gas inlet ports that supply gas from the gas supply apparatus to the chamber may be provided in parallel to the longitudinal direction of the opening, and may be provided at a plane opposing to the opening.

Such a structure is advantageous in that, the gas flow that is outputted from the gas jet ports toward the base material placement table becomes smooth and the laminarization is easily achieved, and stable plasma processing is enabled.

Further, in the plasma processing apparatus of the present invention, a linear portion of each of opposite end portions of the coil may be bent in a direction perpendicular to the extending direction of the coil, and the linear portion may be lead out in the direction opposite to the opening of the cylindrical chamber, so as to be at the outer side of the chamber.

Such a structure can implement the apparatus being excellent in assemblability.

Further, in the plasma processing apparatus of the present invention, in a cross-sectional shape of the chamber taken along a plane perpendicular to the extending direction of the coil, a space inside the chamber may be annular. Still further, in the plasma processing apparatus of the present invention, in a cross-sectional shape of the chamber taken along a plane perpendicular to the extending direction of the coil, a space inside the chamber may be U-shaped. In particular, the latter case is advantageous in that, the gas flow that is outputted from the gas jet port toward the base material placement table becomes smooth and the laminarization is easily achieved, and stable plasma processing is enabled.

Further, in the plasma processing apparatus of the present invention, the coil may be stored in a space of a coil case made of an insulating member, immersed in an insulating fluid in the space, and cooled by the insulating fluid flowing in the space.

Such a structure makes it possible to effectively cool both the solenoid coil and the insulating member storing therein the solenoid coil.

Further, in the plasma processing apparatus of the present invention, a supply system of the gas that supplies gas into the chamber from the gas supply apparatus via the gas inlet port may be structured with at least two systems including a system for sheath gas and a system for plasma gas.

Such a structure is advantageous in achieving stable plasma processing by appropriately adjusting the type of gas, the gas flow rate, or the like for each of the plasma gas suitable for plasma generation and the sheath gas that protects the inner wall of the cylindrical chamber or the wall surface of the insulating member storing therein the solenoid coil.

Further, the number of turns of the coil per unit length may be non-uniform in the extending direction of the coil. Alternatively, the solenoid coil may be structured as being divided into a plurality of pieces in the extending direction of the coil.

Such a structure can improve the uniformity in processing in the longitudinal direction.

The plasma processing method according to the second invention is a plasma processing method comprises: while supplying gas into a cylindrical chamber and jetting out the gas from a slit-like opening formed at the chamber to a base material placed on a base material placement face of the base material placement table, supplying high frequency power to a solenoid coil having a coil extending direction being parallel to a longitudinal direction of the opening to generate a high frequency electromagnetic field in the chamber; and while a state in which the longitudinal direction of the opening and the base material placement face of the base material placement table are parallel to each other is maintained, relatively shifting the chamber and the base material placement table and making a surface of the base material subjected to heat treatment.

In the plasma processing method of the present invention, the base material may be processed in a state in which the wall forming the longitudinal direction of the cylindrical chamber is made of a dielectric material and the solenoid coil is provided on the outer side of the cylindrical chamber. Alternatively, the base material may be processed in a state in which the wall forming the longitudinal direction of the cylindrical chamber is made of metal and the solenoid coil is provided on the inner side of the cylindrical chamber. In particular, in the latter case, it is advantageous in that uniformity in processing in the longitudinal direction is improved, because the structure in which the solenoid coil is not positioned between the plasma jet port and the base material placement table is obtained.

Further, in the plasma processing method of the present invention, it is desirable that the base material is processed in a state in which a plurality of gas inlet ports that supply gas from the gas supply apparatus to the chamber are provided in parallel to the longitudinal direction of the opening and provided at a plane opposing to the opening.

Such a structure is advantageous in that, the gas flow that is outputted from the gas jet ports toward the base material placement table becomes smooth and the laminarization is easily achieved, and stable plasma processing is enabled.

Further, in the plasma processing method of the present invention, it is desirable that the base material is processed in a state in which the linear portion of each of the opposite end portions of the coil is bent in the direction perpendicular to the extending direction of the coil and the linear portion is lead out in the direction opposite to the opening of the cylindrical chamber, so as to be at the outer side of the chamber.

Such a structure implements the processing with the apparatus being excellent in assemblability.

Further, in the plasma processing method of the present invention, the base material may be processed in a state in which, in a cross-sectional shape of the chamber taken along a plane perpendicular to the extending direction of the coil, the space inside the chamber is annular. Alternatively, the base material may be processed in a state in which, in a cross-sectional shape of the chamber taken along a plane perpendicular to the extending direction of the coil, the space inside the chamber is U-shaped. In particular, the latter case is advantageous in that, the gas flow that is outputted from the gas jet port toward the base material placement table becomes smooth and the laminarization is easily achieved, and stable plasma processing is enabled.

Further, in the plasma processing method of the present invention, the base material may be processed in a state in which the coil is stored in the space of a coil case made of an insulating member, immersed in the insulating fluid in the space, and cooled by the insulating fluid flowing in the space.

Such a structure makes it possible to effectively cool both the solenoid coil and the insulating member storing therein the solenoid coil.

Further, in the plasma processing method of the present invention, it is desirable that the base material is processed in a state in which a supply system of the gas that supplies gas into the chamber from the gas supply apparatus via the gas inlet port is structured with at least two systems including a system for sheath gas and a system for plasma gas.

Such a structure is advantageous in achieving stable plasma processing by appropriately adjusting the type of gas, the gas flow rate, or the like for each of the gas suitable for plasma generation and the gas that protects the inner wall of the cylindrical chamber or the wall surface of the insulating member storing therein the solenoid coil.

Further, in the plasma processing method of the present invention, the base material may be processed in a state in which the number of turns of the coil per unit length is non-uniform in the extending direction of the coil. Alternatively, the base material may be processed in a state in which the solenoid coil is structured as being divided into a plurality of pieces in the extending direction of the coil.

Such a structure can improve the uniformity in processing in the longitudinal direction.

Advantageous Effects of Invention

The present invention makes it possible to process the entire desired processing target region of the base material in a short time, in subjecting the proximity of the surface of the base material uniformly to high-temperature heat treatment just for a short time.

BRIEF DESCRIPTION OF DRAWINGS

These and other objects and features of the present invention will become apparent from the following description taken in conjunction with the preferred embodiments thereof with reference to the accompanying drawings, in which:

FIG. 2A is a cross-sectional end view taken along line A-A in FIG. 1A, showing the structure of the plasma processing apparatus according to the first embodiment of the present invention;

FIG. 3 is a cross-sectional view showing the structure of the plasma processing apparatus according to the first embodiment of the present invention;

FIG. 4 is a cross-sectional end view taken along line B-B shown in FIG. 3, showing the structure of the plasma processing apparatus according to the first embodiment of the present invention;

FIG. 10B is a bottom view of the plasma processing apparatus showing the relationship among the plasma processing apparatus according to the fourth embodiment of the present invention shown in FIG. 9A, a base material, and a base material placement table;

FIG. 11 is a cross-sectional view showing the structure of a plasma processing apparatus according to a fifth embodiment of the present invention;

FIG. 15A is a cross-sectional view showing the structure of a plasma processing apparatus according to an eighth embodiment of the present invention;

FIG. 15B shows a multiplex spiral coil that can be used in place of the spiral solenoid coil in the aforementioned various embodiments of the present invention;

FIG. 16 is a schematic view for describing a semiconductor film crystallization method using thermal plasma, as a conventional example;

DESCRIPTION OF EMBODIMENTS

In the following, with reference to the drawings, a detailed description will be given of a first embodiment of the present invention.

In the following, with reference to the drawings, a description will be given of thermal plasma processing apparatuses according to embodiments of the present invention.

First Embodiment

In the following, with reference to FIGS. 1A to 4, a description will be given of a first embodiment of the present invention.

Figure 1A:
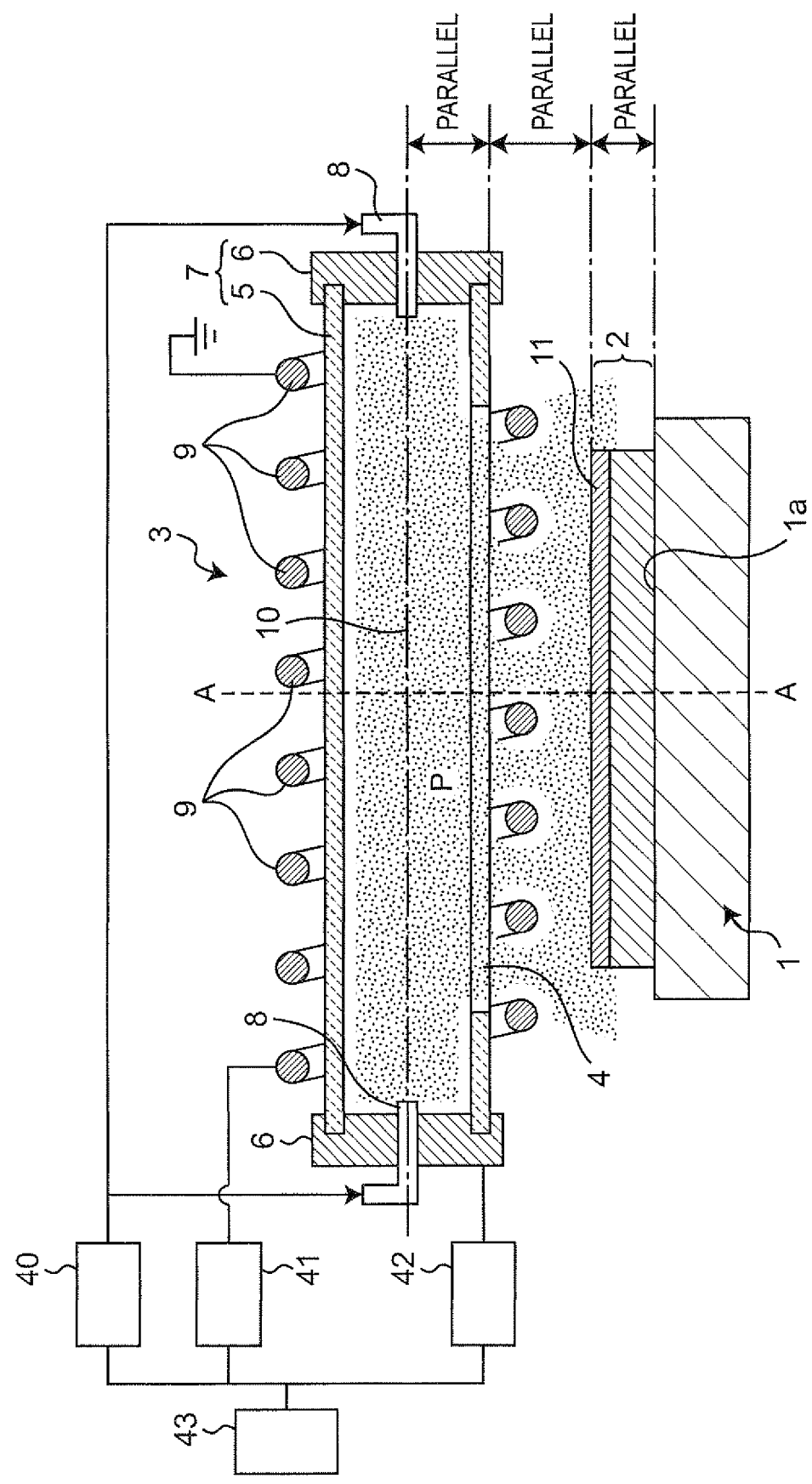
FIG. 1A is a cross-sectional view showing the structure of a plasma processing apparatus according to a first embodiment of the present invention.
Figure 1B:
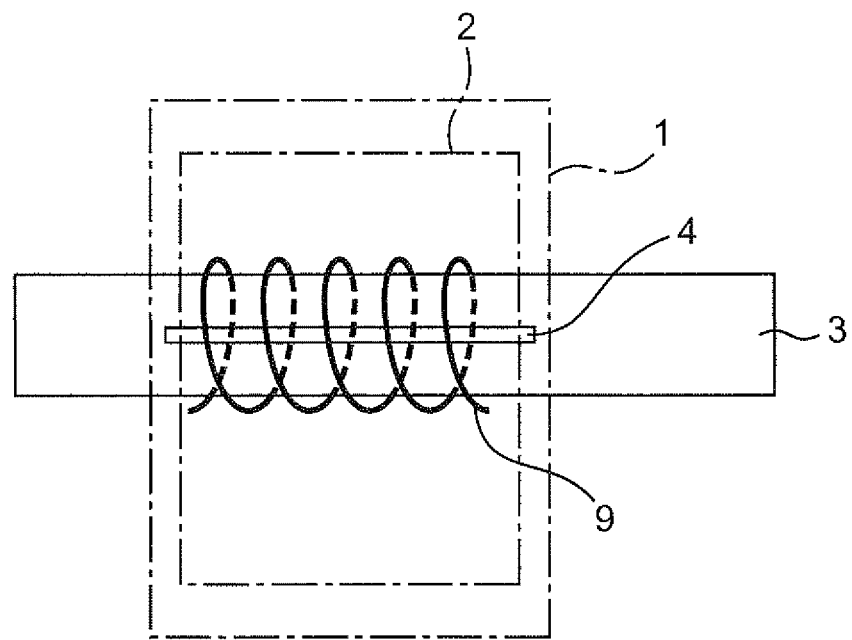
FIG. 1B is a bottom view of the plasma processing apparatus showing the relationship among the plasma processing apparatus according to the first embodiment of the present invention, a quadrilateral base material, and a base material placement table.
Figure 1C:
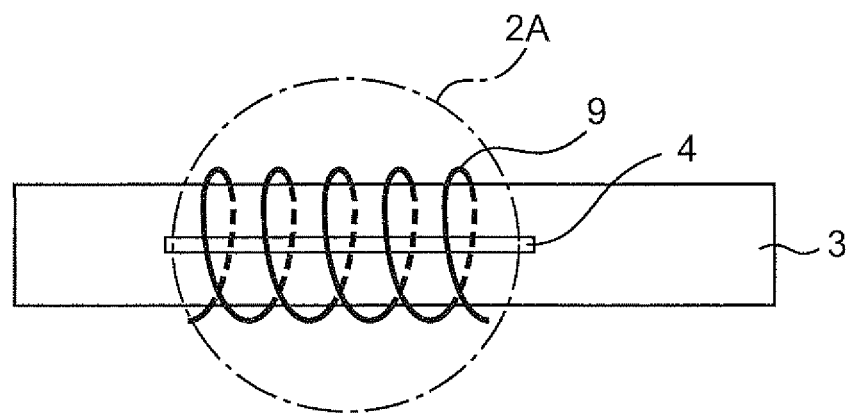
FIG. 1C is a bottom view of the plasma processing apparatus showing the relationship among the plasma processing apparatus according to the first embodiment of the present invention, a circular base material, and the base material placement table.

FIG. 1A shows the structure of a thermal plasma processing apparatus according to the first embodiment of the present invention. FIG. 1B is a bottom view of the plasma processing apparatus showing the relationship among the plasma processing apparatus according to the first embodiment of the present invention, a quadrilateral base material 2, and a base material placement table 1. FIGS. 1A and 1B are each a cross-sectional view taken along a plane parallel to the longer direction of an inductively coupled plasma torch unit 3, the plane including a center axis 10 of a solenoid coil 9 and being perpendicular to the surface of the base material 2. Further, FIG. 2A is a cross-sectional end view taken along dashed line A-A shown in FIG. 1A. It is to be noted that, in the following description, though the base material 2 is described as being quadrilateral, as shown in FIG. 1C, the plasma processing apparatus according to the first embodiment of the present invention can be applied to a circular base material 2A (the base material placement table 1 is not shown).

An example of the base material 2 may be a semiconductor substrate.

In FIGS. 1A and 2A, the base material 2 is placed on a rectangular or circular base material placement face 1a of the base material placement table 1. The inductively coupled plasma torch unit 3 is structured with a cylindrical chamber 7, gas jet ports 8 as one example of the gas inlet port, and a solenoid coil 9.

The cylindrical chamber 7 is structured with a cylinder 5 that is provided with a rectangular slit-like plasma jet port 4 (which may also be referred to as the "opening") at its lower end face and that is made of an insulating material, and lids 6 that close opposite ends of the cylinder 5, respectively.

The gas jet ports 8 are each structured with a gas jet tube inserted from the center portion of each lid 6 into the cylindrical chamber 7, and supply gas from a gas supply apparatus 40 into the cylindrical chamber 7 at a certain flow rate.

The solenoid coil 9 is disposed on the outer side of the cylinder 5 coaxially with respect to the center axis 10 of the cylinder 5. The solenoid coil 9 supplies high frequency power from the high frequency power supply 41 to generate a high frequency electromagnetic field in the cylindrical chamber 7.

The base material placement table 1 (or the base material 2 placed on the base material placement face 1a of the base material placement table 1) is disposed to oppose to the plasma jet port 4. In this state, while gas is supplied from the gas jet ports 8 into the cylindrical chamber 7 and jetted out from the plasma jet port 4 toward the base material 2, high frequency power is supplied from the high frequency power supply 41 to the solenoid coil 9. Thus, plasma P is generated in the cylindrical chamber 7, and the plasma P is emitted from the plasma jet port 4 to the base material 2.

The direction of the center axis 10 of the solenoid coil 9, the longitudinal direction of the plasma jet port 4 (the opening), and the base material placement face 1a of the base material placement table 1 (the surface of the base material 2) are disposed in parallel to one another. The direction of the center axis 10 of the solenoid coil 9 means the extending direction of the solenoid coil 9 (the coil extending direction). Further, the base material surface can be subjected to heat treatment while the plasma torch unit 3 including the cylindrical chamber 7 and the base material placement table 1 are relatively shifted by the shifting apparatus 42 at a constant speed in the direction that crosses the longitudinal direction of the plasma jet port 4 (the opening), for example, from the viewpoint of improving the production efficiency, in the direction perpendicular to the longitudinal direction of the plasma jet port 4 (the opening) (the direction perpendicular to the paper plane of FIG. 1A, the direction indicated by the arrow shown in FIG. 2A). In this manner, the proximity of the surface 11 of the base material 2 can evenly be subjected to heat treatment.

Figure 2B:
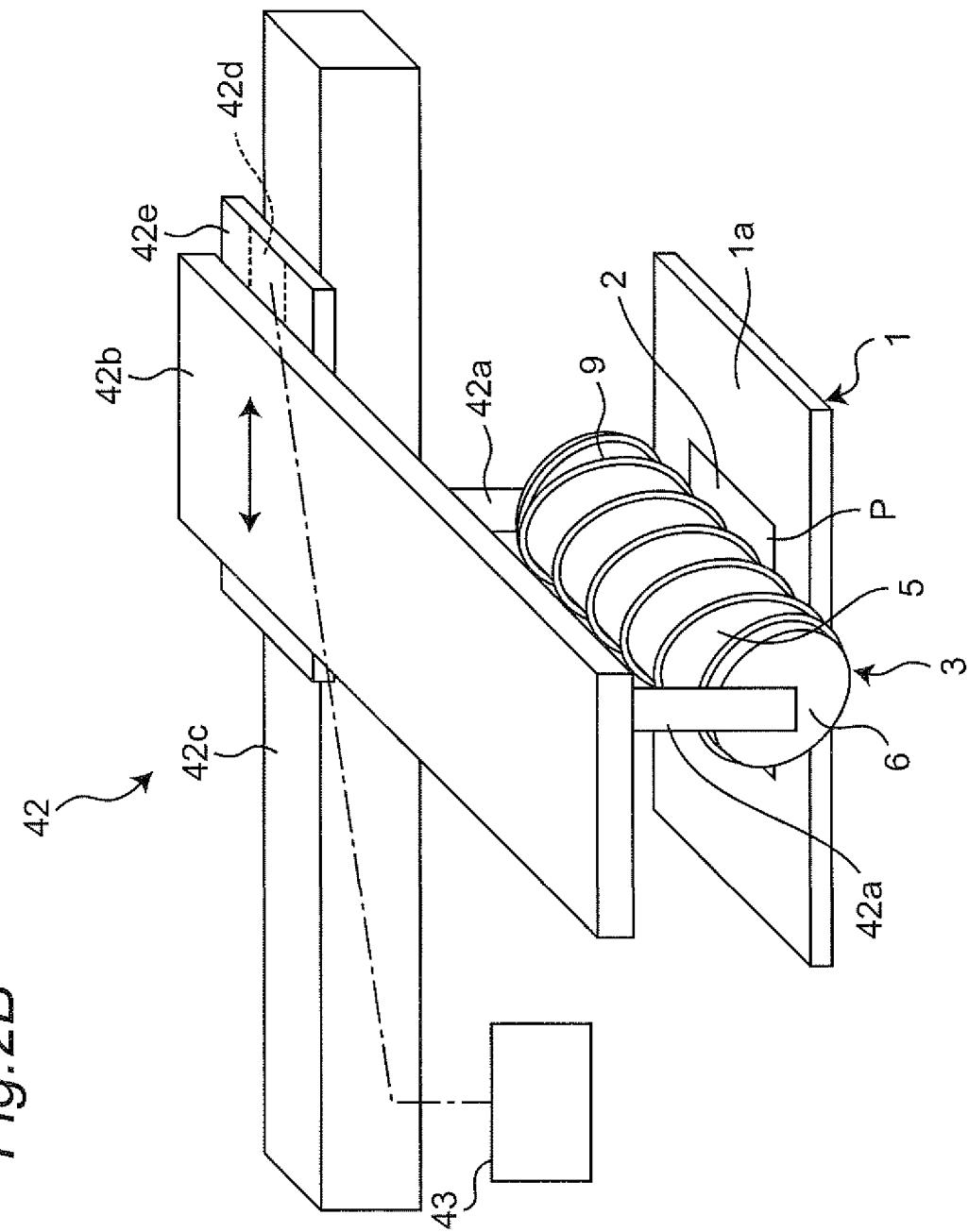
FIG. 2B is a perspective view showing a shifting apparatus of the plasma processing apparatus according to the first embodiment of the present invention.

FIG. 2B shows one example of the shifting apparatus 42 that shifts the plasma torch unit 3 at a constant speed relative to the fixed base material 2 on the fixed base material placement table 1. In FIG. 2B, the shifting apparatus 42 is structured with: a bracket 42b to which plasma torch unit support arms 42a supporting the plasma torch unit 3 at the opposite ends are fixed; a rail 42c that extends along the shifting direction (the coil extending direction) of the shifting apparatus 42; and a shift stage 42e to which the bracket 42b is fixed. The shift stage 42e shifts the bracket 42b at a constant speed along the rail 42c to which a screw shaft engaged with the motor 42d is fixed, by regularly and reversely rotating a shift driver motor 42d provided as one example of the shift driver apparatus. Hence, under control of the control apparatus 43, the shift driver motor 42d regularly rotates, whereby the shift stage 42e forwardly or backwardly shifts at a constant speed along the rail 42c. Thus, the plasma torch unit 3 can be shifted through the bracket 42b and a pair of support arms 42a relative to the base material 2.

In this manner, under the control of the control apparatus 43, plasma processing can be performed while causing the plasma torch unit 33 to shift over the base material 2 at a constant speed by the shifting apparatus 42.

When the plasma torch unit 33 is shifted over the base material 2 by the shifting apparatus 42, the shifting direction may be unidirectional or reciprocating.

The shifting apparatus 42 is applicable to other embodiments or variations, which will be described later.

The control apparatus 43 controls the operations of the gas supply apparatus 40, the high frequency power supply 41, the shifting apparatus 42, and the like so that desired plasma processing is performed.

The solenoid coil 9 is a spiral copper pipe disposed coaxially with respect to the cylinder 5 and on the outer side of the cylinder 5, to allow cooling water to flow inside to achieve cooling. In order to prevent copper from being mixed into plasma and to suppress arc discharge, the surface of the solenoid coil 9 is coated by an insulating film. Further, cooling water piping is provided at each of the inside of the member structuring the cylinder 5 and the inside of the lids 6. By allowing the cooling water to flow inside each cooling water piping, the cylinder 5 and the lids 6 are cooled, and thermal damage attributed to the plasma P is reduced. It is also possible to structure the cylinder 5 with two cylinder members made of an insulating material differing in diameter, so that the gap between the two cylinder members serves as the cooling water piping.

In this structure, the wall forming the longitudinal direction of the cylindrical chamber 7 is made of a dielectric material (the cylinder 5); the solenoid coil 9 is provided on the outer side of the cylindrical chamber 7; and a part of the solenoid coil 9 is positioned between the plasma jet port 4 and the base material placement table 1.

Further, since the longer direction length of the plasma jet port 4 is greater than the width of the base material 2, the entire proximity of the surface 11 of the base material 2 can be subjected to heat treatment by performing a single scanning (i.e., relatively shifting the plasma torch unit 3 and the base material placement table 1).

Still further, the gas jet ports 8 supplying the gas into the cylindrical chamber 7 are provided at the planes perpendicular to the center axis direction (the extending direction) of the solenoid coil 9 at the two lids 6.

With such a thermal plasma processing apparatus, heat treatment such as crystallization of the semiconductor film can be performed in the following manner. Cooling water is allowed to flow inside the solenoid coil 9, and also inside the cooling water piping in each of the cylinder 5 and the lids 6 to perform cooling; Ar or Ar+$H_2$ gas is supplied from the gas jet ports 8 into the cylindrical chamber 7; and the gas is jetted out from the plasma jet port 4 to the base material 2. During such procedures, high frequency power of 13.56 MHz is supplied to the solenoid coil 9 from the high frequency power supply 41, to generate plasma P in the cylindrical chamber 7. The plasma P is emitted from the plasma jet port 4 to the base material 2 and scanning is performed.

In this manner, while the direction of the center axis 10 of the solenoid coil 9, the longitudinal direction of the plasma jet port 4, and the base material placement face 1a of the base material placement table 1 (the surface of the base material 2) are maintained to be parallel to one another, the cylindrical chamber 7 and the base material placement table 1 are relatively shifted in the direction perpendicular to the longitudinal direction of the plasma jet port 4. Therefore, it becomes possible to structure such that the length of the plasma P to be generated and the processed length of the base material 2 are substantially equal to each other. With such a structure, heat treatment of the base material 2 is finished by a single relative shifting of the cylindrical chamber 7 and the base material placement table 1. Thus, the production efficiency becomes high. It is to be noted that, in the case where a few times of relative shifting of the cylindrical chamber 7 and the base material placement table 1 suffice, the production efficiency higher than the conventional case where reciprocating shifting is performed for hundreds of times can be achieved even when the length of the plasma P to be generated is shorter than the processing length of the base material 2.

Further, the width (the width of the inner space of the cylindrical chamber 7 in FIGS. 2A and 4) of the cross section of the cylindrical chamber 7 taken along the plane vertical to the center axis thereof is only required to be greater than the width of the plasma jet port 4 (the length of the gap in FIGS. 2A and 4) by a slight amount. That is, the volume of plasma P to be generated can largely be reduced as compared to the conventional case. As a result, the power efficiency is drastically increased.

Further, maintenance of the state in which the direction of the center axis 10 of the solenoid coil 9 and the longitudinal direction of the plasma jet port 4 are disposed in parallel to each other secures uniformity of the thermal plasma in the longer direction. Therefore, in the inner space of the cylindrical chamber 7, relatively uniform plasma in the direction of the center axis 10 can be generated. Thus, plasma becomes uniform in the longer direction, and the base material 2 can uniformly be processed. That is, the purpose of maintaining the state in which the direction of the center axis 10 of the solenoid coil 9 and the longitudinal direction of the plasma jet port 4 being disposed in parallel to each other is to secure the uniformity of the thermal plasma in the longer direction. When the parallel relationship is greatly damaged, thermal plasma becomes non-uniform in the longer direction, which is not preferable. Further, the purpose of maintaining the state in which the direction of the center axis 10 of the solenoid coil 9, the longitudinal direction of the plasma jet port 4, and the base material placement face 1a of the base material placement table 1 (the surface of the base material 2) are disposed in parallel to one another is to improve the production efficiency. Hence, the parallel relationship of the direction of the center axis 10 of the solenoid coil 9, the longitudinal direction of the plasma jet port 4, and the base material placement face 1a of the base material placement table 1 (the surface of the base material 2) is preferably maintained not only in the present embodiment but also in the other embodiments.

It is to be noted that, as shown in FIGS. 3 and 4, it is also possible to structure such that the alignment direction of the gas jet ports 8 supplying gas in the cylindrical chamber 7 is parallel to the direction of the center axis 10 of the solenoid coil 9 (in other words, such that the gas jetting direction from the gas jet ports 8 is perpendicular to the direction of the center axis 10 of the solenoid coil 9), and is provided at the plane being parallel to the plasma jet port 4 (the opening). In this structure, the gas flow direction in the cylindrical chamber 7 is the direction perpendicular to the center axis of the solenoid coil 9. Such a structure is advantageous in that the gas flow directed from the gas jet ports 8 toward the base material placement table 1 becomes smooth; the laminarization is easily achieved; and stable plasma processing is enabled. It is to be noted that, FIG. 4 is the cross-sectional end view taken along dashed line B-B shown in FIG. 3.

It is to be noted that, it has exemplarily been shown that the entire cylinder 5 is made of an insulating material. However, what is required is only that the high frequency electromagnetic field generated by the supply of the high frequency power to the solenoid coil 9 is emitted into the cylindrical chamber 7. Therefore, the cylinder 5 may be structured with a cylinder made of a metal material provided with a window made of an insulating material. For example, a plurality of strip-like windows which are parallel to the center axis 10 of the solenoid coil 9 can generate plasma without largely impairing the transmission efficiency of the high frequency electromagnetic field.

Further, from the viewpoint of shortening the heat treatment as much as possible, as one example, it is preferable to set the width of the plasma jet port 4 to 1 mm, and the shifting speed to 1 to several mm/sec.

According to the first embodiment of the present invention, in subjecting the proximity of the surface of the base material 2 to high-temperature heat treatment uniformly just for a short time, the desired entire processing target region of the base material 2 can be processed in a short time.

Second Embodiment

In the following, with reference to FIGS. 5A to 6, a description will be given of a second embodiment of the present invention.

Figure 5A:
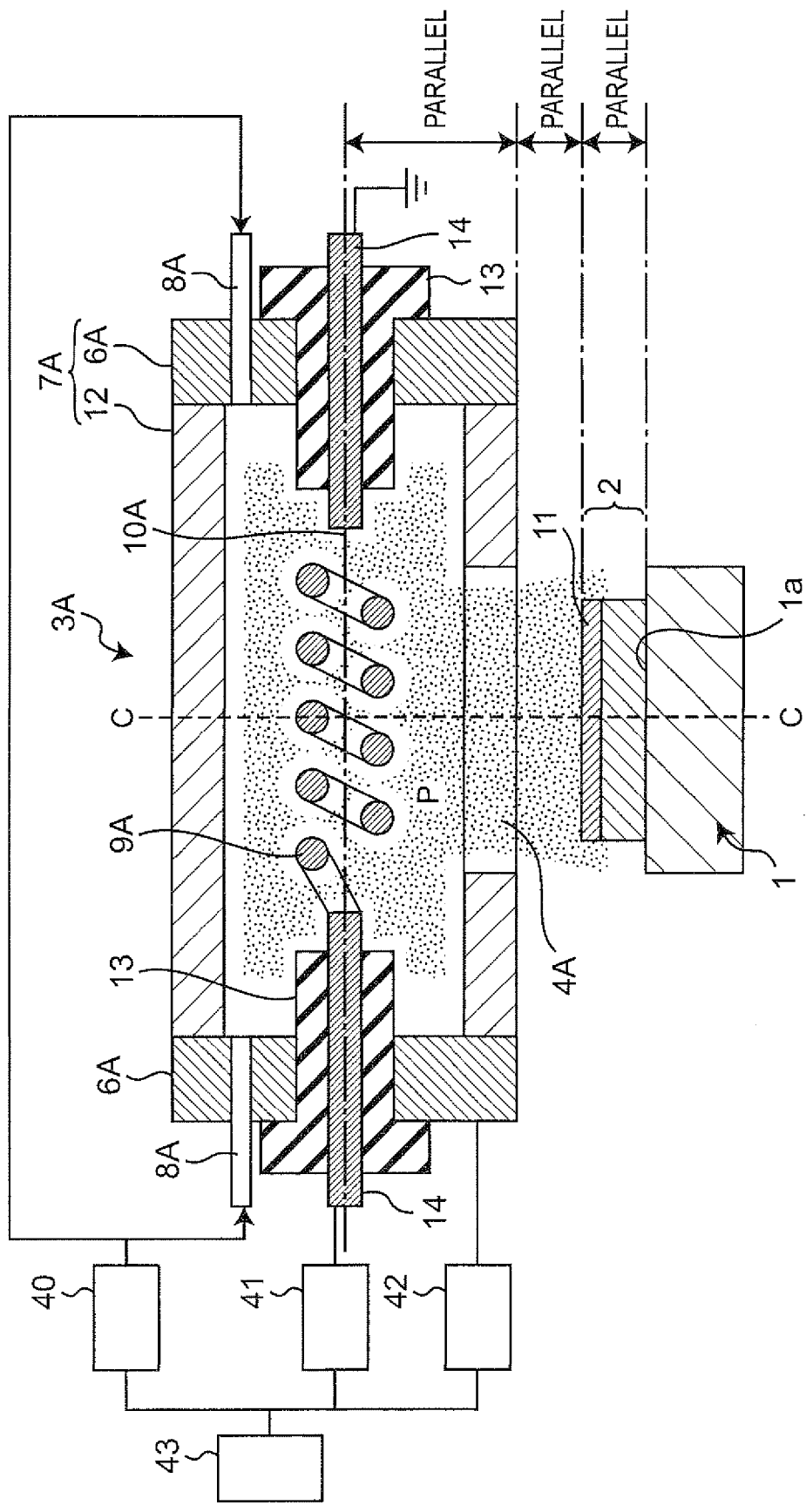
FIG. 5A is a cross-sectional view showing the structure of a plasma processing apparatus according to a second embodiment of the present invention.
Figure 5B:
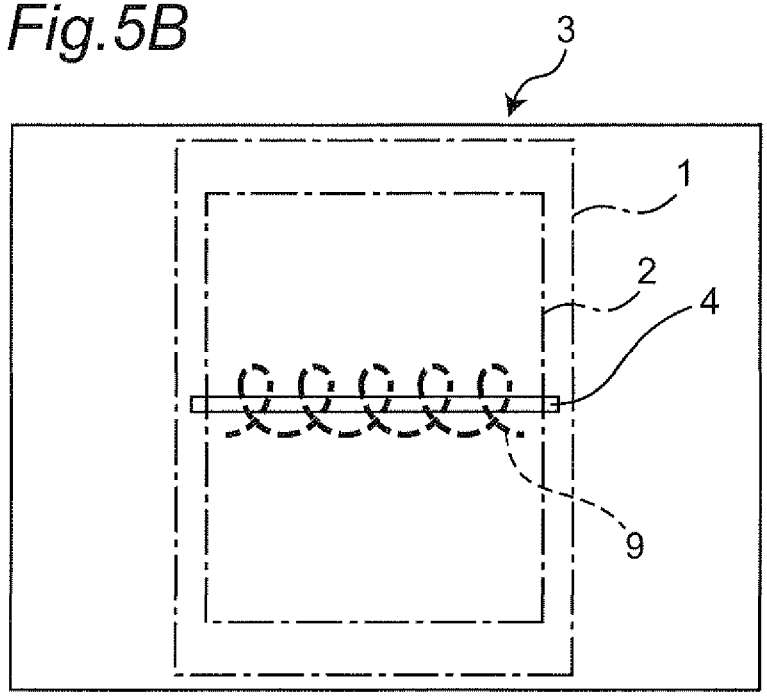
FIG. 5B is a bottom view showing the plasma processing apparatus showing the relationship among the plasma processing apparatus according to the second embodiment of the present invention shown in FIG. 5A, a base material, and a base material placement table.

FIG. 5A shows the structure of a thermal plasma processing apparatus according to the second embodiment of the present invention. FIG. 5A is a cross-sectional view taken along a plane parallel to the longer direction of an inductively coupled plasma torch unit 3A, the plane including a center axis 10A of a solenoid coil 9A, and being perpendicular to the surface of the base material 2. Further, FIG. 5B is a bottom view of a plasma processing apparatus showing the relationship among the plasma processing apparatus according to the second embodiment of the present invention shown in 5A, the base material, and the base material placement table. FIG. 6 is a cross-sectional end view taken along dashed line C-C shown in FIG. 5A.

Figure 6:
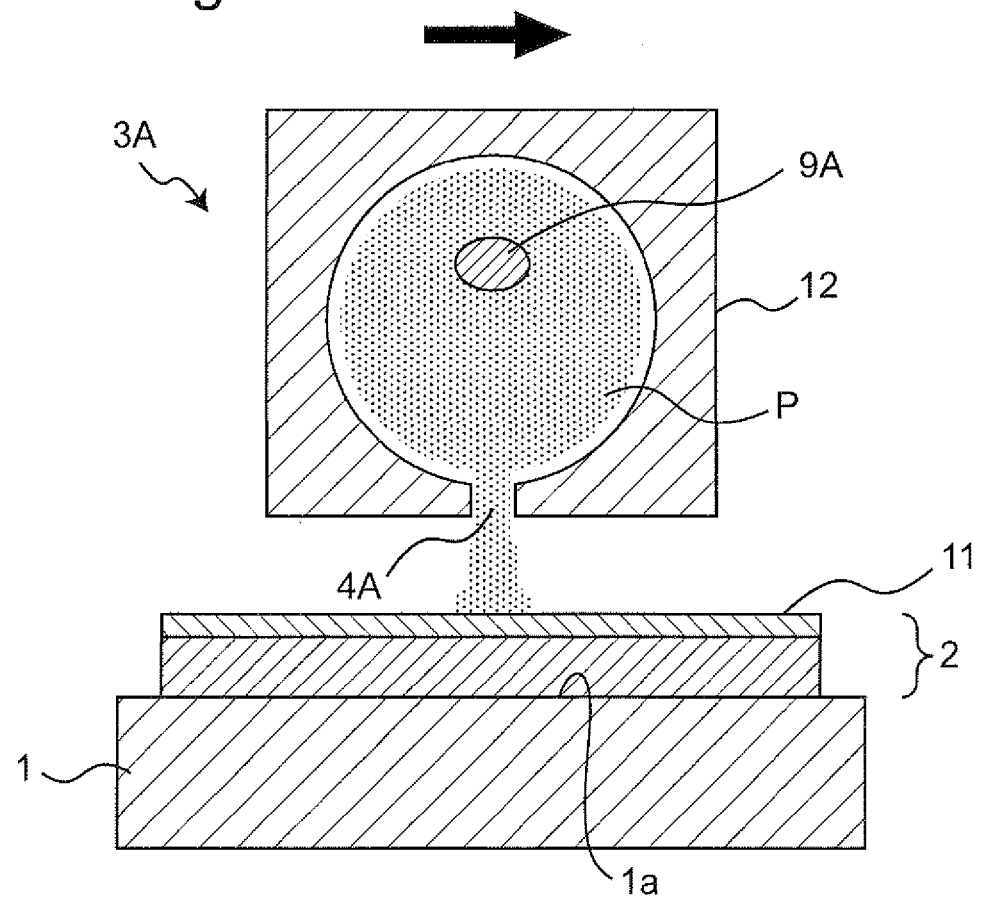
FIG. 6 is a cross-sectional end view taken along line C-C shown in FIG. 5A, showing the structure of the plasma processing apparatus according to the second embodiment of the present invention.

In FIGS. 5A and 6, the base material 2 is placed on the base material placement face 1a of the base material placement table 1. The inductively coupled plasma torch unit 3A is structured with a cylindrical chamber 7A, gas jet ports 8A as one example of the gas inlet port, and a solenoid coil 9A.

The cylindrical chamber 7A is structured with: a cylinder 12 that is provided with a rectangular slit-like plasma jet port 4A (the opening) at the center portion of the lower end face, the cylinder 12 being made of a metal material whose outer shape is quadrangular prism-like having a circular space formed inside; and lids 6A made of a metal material that close opposite ends of the cylinder 12, respectively.

The gas jet ports 8A are each structured with a gas jet tube inserted from the upper portion of each lid 6A into the cylindrical chamber 7A, and supply gas into the cylindrical chamber 7A.

The solenoid coil 9A is disposed in the circular space inside the cylinder 12 coaxially with respect to the center axis 10A of the cylinder 12. The solenoid coil 9A supplies high frequency power from the high frequency power supply 41 to generate a high frequency electromagnetic field in the cylindrical chamber 7A. Bushes 13 made of an insulating material are inserted in the axial direction at the center portion of the two lids 6A, respectively. Linear portions 14 made of a conductive material such as copper at the opposite end portions of the solenoid coil 9A are lead out to the outside of the cylindrical chamber 7A for supplying electricity to the solenoid coil 9A. While gas is supplied from the gas jet ports 8A into the cylindrical chamber 7A and jetted out from the plasma jet port 4A toward the base material 2, high frequency power is supplied from the high frequency power supply 41 to the solenoid coil 9A. Thus, plasma P is generated in the cylindrical chamber 7, and the plasma P is emitted from the plasma jet port 4A to the base material 2.

The direction of the center axis 10A of the solenoid coil 9A, the longitudinal direction of the plasma jet port 4A (the opening), and the base material placement face 1a of the base material placement table 1 (the surface of the base material 2) are disposed in parallel to one another. The direction of the center axis 10 of the solenoid coil 9A means the extending direction of the solenoid coil 9A (the coil extending direction). Further, the base material surface can be subjected to heat treatment while the plasma torch unit 3A including the cylindrical chamber 7A, and the base material placement table 1 are relatively shifted by the shifting apparatus 42 in the direction that crosses the longitudinal direction of the plasma jet port 4A (the opening), for example, from the viewpoint of improving the production efficiency, in the direction perpendicular to the longitudinal direction of the plasma jet port 4 (the opening) (the direction perpendicular to the paper plane of FIG. 5A, the direction indicated by the arrow shown in FIG. 6). In this manner, the proximity of the surface 11 of the base material 2 can evenly be subjected to heat treatment.

The solenoid coil 9A is a spiral copper pipe disposed coaxially with respect to the cylinder 12 and in the circular space in the cylinder 12, to allow cooling water to flow inside to achieve cooling. In order to prevent copper from being mixed into plasma and to suppress arc discharge, the surface of the solenoid coil 9A is coated by an insulating film. Further, cooling water piping is provided at each of the inside of the member structuring the cylinder 12 and the inside of the lids 6A. By allowing the cooling water to flow inside each cooling water piping, the cylinder 12 and the lids 6A are cooled, and thermal damage attributed to the plasma P is reduced.

In this structure, the wall forming the longitudinal direction of the cylindrical chamber 7A is made of metal (the cylinder 12); the solenoid coil 9A is provided inside the cylindrical chamber 7A; and any part of the solenoid coil 9A is not positioned between the plasma jet port 4A and the base material placement table 1. Therefore, there is an advantage in that the uniformity in processing the longitudinal direction is improved as compared to the structure of the first embodiment.

Further, since the longer direction length of the plasma jet port 4A is greater than the width of the base material 2, the entire proximity of the surface 11 of the base material 2 can be subjected to heat treatment by performing a single scanning (i.e., relatively shifting the plasma torch unit 3A and the base material placement table Still further, the gas jet ports 8A supplying the gas into the cylindrical chamber 7A are provided at the planes perpendicular to the center axis direction (the extending direction) of the solenoid coil 9A at the two lids 6A.

With such a thermal plasma processing apparatus, heat treatment such as crystallization of the semiconductor film can be performed in the following manner. While Ar or Ar+$H_2$ gas is supplied from the gas jet ports 8A into the cylindrical chamber 7A, the gas is jetted out from the plasma jet port 4A to the base material 2. During such procedures, high frequency power of 13.56 MHz is supplied to the solenoid coil 9A from the high frequency power supply 41, to generate plasma P in the cylindrical chamber 7A. The plasma P is emitted from the plasma jet port 4A to the base material 2 and scanning is performed.

In the foregoing first embodiment, the solenoid coil 9 is coupled with plasma through the cylinder 5 made of an insulating material inside which flow channel of cooling water is provided. In contrast, in the second embodiment, since the solenoid coil 9A is coupled with plasma at the position so close to the plasma that it directly contacts the plasma. Therefore, the second embodiment is more advantageous than the first embodiment in excellent power efficiency.

Third Embodiment

In the following, with reference to FIGS. 7 and 8, a description will be given of a third embodiment of the present invention.

Figure 7:
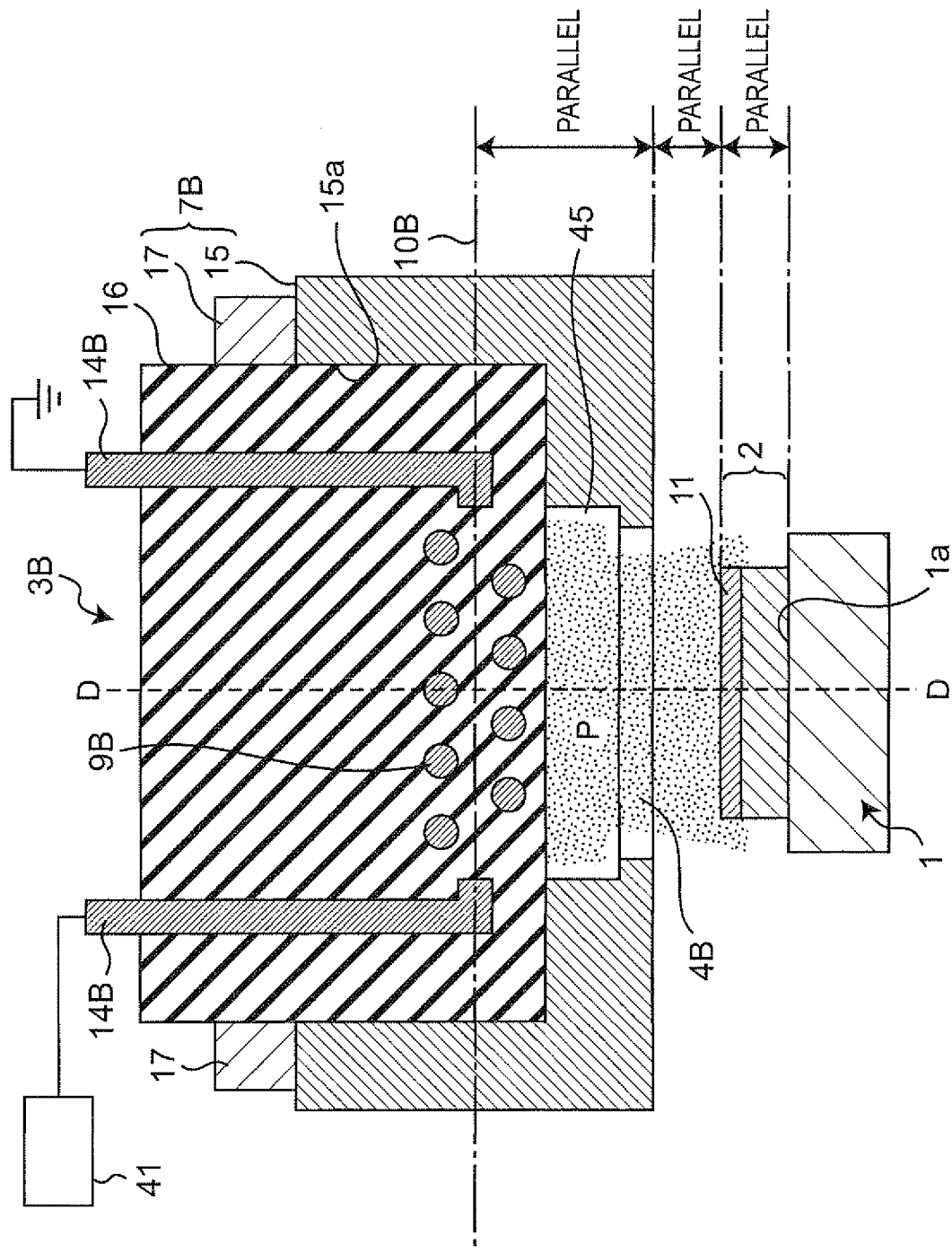
FIG. 7 is a cross-sectional view showing the structure of a plasma processing apparatus according to a third embodiment of the present invention.

FIG. 7 shows the structure of a thermal plasma processing apparatus according to the third embodiment of the present invention. FIG. 7 is a cross-sectional view taken along a plane parallel to the longer direction of an inductively coupled plasma torch unit 3B, the plane including a center axis 10B of a solenoid coil 9B, and being perpendicular to the surface of the base material 2. Further, FIG. 8 is a cross-sectional end view taken along dashed line D-D shown in FIG. 7.

Figure 8:
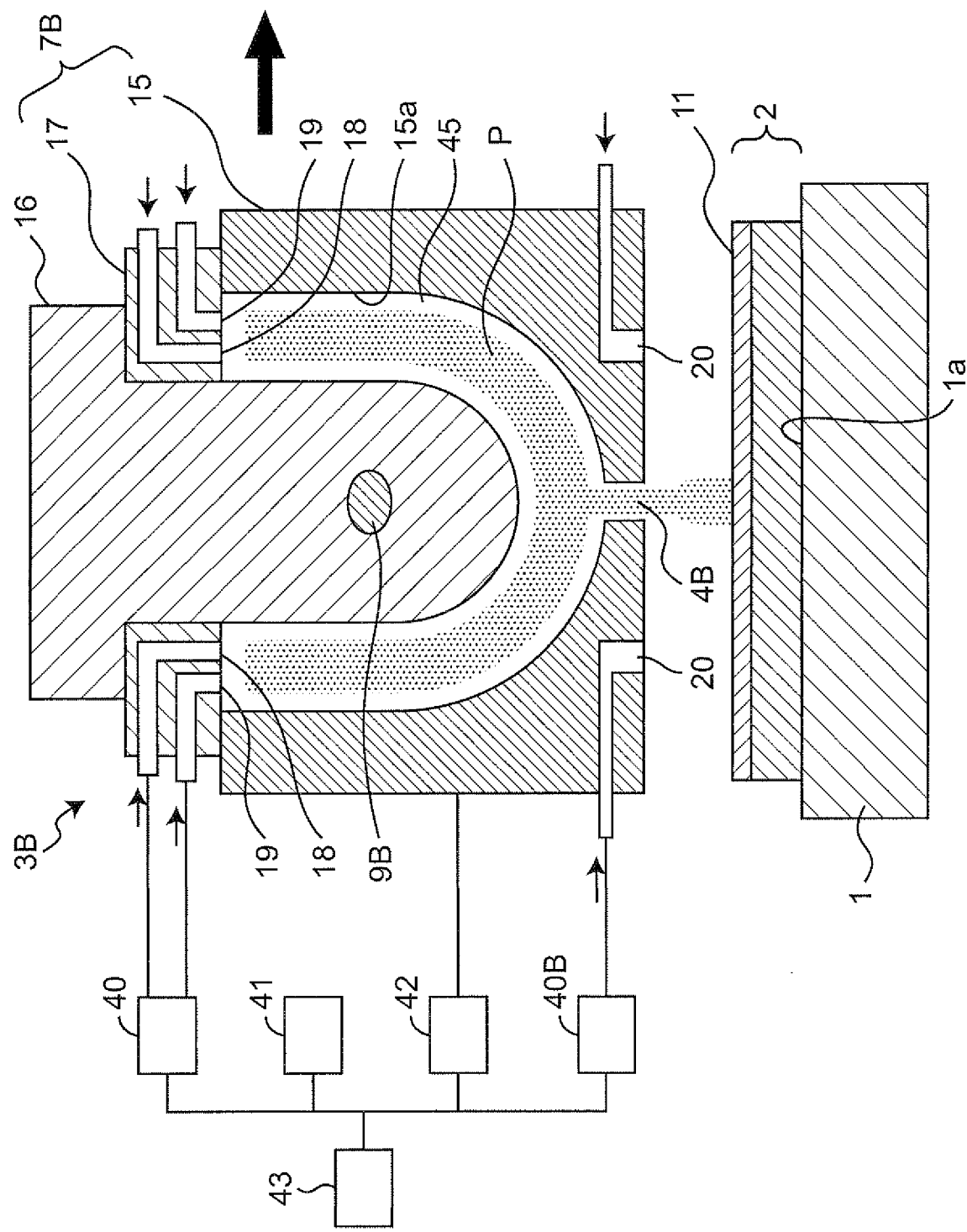
FIG. 8 is a cross-sectional end view taken along line D-D shown in FIG. 7, showing the structure of the plasma processing apparatus according to the third embodiment of the present invention.

In FIGS. 7 and 8, the base material 2 is placed on the base material placement face 1a of the base material placement table 1. The inductively coupled plasma torch unit 3B is substantially structured with a cylindrical chamber 7B and a coil case 16, which is an insulating member having a downwardly convex shape whose tip is semicircular.

The cylindrical chamber 7B is structured with a base block 15 and an elongated ring 17.

The base block 15 is structured with a quadrangular prism-like metal material (e.g., brass) that is provided with a rectangular slit-like plasma jet port 4B (the opening) at its lower end face and that has a concave portion 15a opening at its upper surface and being greatly curved downward. At the lower end face of the concave portion 15a, the plasma jet port 4B (the opening) is formed.

The elongated ring 17 is a quadrilateral frame shaped member disposed between the base block 15 and the coil case 16. At the elongated ring 17, a multitude of sheath gas jet ports 18 that supply gas into the cylindrical chamber 73 and a multitude of plasma gas jet ports 19 are downwardly formed, i.e., so as to discharge gas toward the base material placement table 1. The sheath gas jet ports 18 and the plasma gas jet ports 19 are each structured with a gas jet tube inserted into the elongated ring 17, and supply gas into the cylindrical chamber 7B from the gas supply apparatus 40 independently of one another at a certain flow rate. It is preferable that the sheath gas jet ports 18 and the plasma gas jet ports 19 are each disposed such that, for example, a plurality of openings are disposed in parallel to the coil extending direction, or one or more slit-shaped opening is disposed in parallel to the coil extending direction. The sheath gas supplied at a certain flow rate from the gas supply apparatus 40 through the sheath gas jet ports 18 is supplied for protecting the wall surface of the insulating member (the coil case 16) that stores the solenoid coil 9B. As the sheath gas, Ar+H$_2$ gas or the like is used. The plasma gas supplied from the gas supply apparatus 40 through the plasma gas jet ports 19 at a certain flow rate is supplied because it is required for generating plasma, and Ar gas or the like is used.

The coil case 16 is structured with an insulating material (e.g., a dielectric material (such as ceramic and quartz)) storing the solenoid coil 9B therein. The coil case 16 is inserted into the concave portion 15a of the base block 15 from above, to form a space 45 having a U-shaped cross-section between the bottom face of the concave portion 15a and the coil case 16.

The solenoid coil 9 generates a high frequency electromagnetic field in the cylindrical chamber 7. The coil case 16 is made of a dielectric material, for example.

For supplying power to the solenoid coil 9B, the linear portions 14B at the opposite end portions of the solenoid coil 9B are bent in the direction perpendicular to the direction of the center axis 10B of the solenoid coil 9B, and are led out to the outside of the coil case 16 in the direction opposite to the plasma jet port 4B.

With such a structure, in the state in which the solenoid coil 9B is previously installed in the coil case 16, the coil case 16, the base block 15, and the ring 17 can be assembled. Thus, the apparatus that can easily be assembled can be implemented.

During the procedure of supplying the gas at a certain flow rate from the gas jet ports 18 and 19 by the gas supply apparatus 40 into the cylindrical chamber 7B and jetting out the gas toward the base material 2 from the plasma jet port 4B, high frequency power is supplied to the solenoid coil 9B from the high frequency power supply 41. Thus, plasma P is generated in the space 45 of the cylindrical chamber 7B, and the plasma P is emitted to the base material 2 from the plasma jet port 4B. The direction of the center axis 10B of the solenoid coil 9B, the longitudinal direction of the plasma jet port 4B (the opening), and the base material placement face 1a of the base material placement table 1 are arranged in parallel to one another. The base material surface can be subjected to heat treatment while the plasma torch unit 3B including the cylindrical chamber 7B, and the base material placement table 1 are relatively shifted by the shifting apparatus 42 in the direction perpendicular to the longitudinal direction of the plasma jet port 4B (the opening) (the direction perpendicularly penetrating through the paper plane of FIG. 7, the direction indicated by the arrow in FIG. 8). Thus, the heat treatment can be performed uniformly to the proximity of the surface 11 of the base material 2.

The solenoid coil 9B is a spiral copper pipe, inside which cooling water is allowed to flow to achieve cooling. Thus, cooling of the coil case 16 can also be realized. Further, cooling water piping is provided at each of the inside of the base block 15 and the inside of the ring 17. By allowing the cooling water to flow inside each cooling water piping, the base block 15 and the ring 17 are cooled, and thermal damage attributed to the plasma P is reduced.

In this structure, the wall forming the longitudinal direction of the cylindrical chamber 7B is made of metal (the base block 15 and the ring 17), and the solenoid coil 9B is provided inside the cylindrical chamber 7B. Therefore, there are no obstacles between the plasma jet port 49 and the base material placement table 1, and uniformity in processing the longitudinal direction improves.

Further, since the longer direction length of the plasma jet port 49 is greater than the width of the base material 2, the entire proximity of the surface 11 of the base material 2 can be subjected to heat treatment by performing a single scanning (i.e., relatively shifting the plasma torch unit 3B and the base material placement table 1).

Still further, the gas jet ports 18 and 19 that supply gas into the cylindrical chamber 7B at a certain flow rate are provided at the planes that are in parallel to the direction of the center axis 10B of the solenoid coil 9B and opposing to the plasma jet port 4B.

In this structure, the direction of the gas flow in the cylindrical chamber 7B becomes perpendicular to the center axis 10B of the solenoid coil 99. With this structure, the gas flow from the gas jet ports 18 and 19 toward the base material placement table 1 becomes smooth; the laminarization is easily achieved; and stable plasma processing is enabled.

Further, as shown in FIG. 8, at the plane of the base block 15 opposing to the base material placement face 1a of the base material placement table 1, a plurality of shielding gas jet ports 20 are provided such that the plasma jet port 4B is interposed between them. It is preferable that a plurality of shielding gas jet ports 20 are disposed at regular intervals along the direction (the direction perpendicularly penetrating through the paper plane of FIG. 7, the direction of the arrow in FIG. 8) perpendicular to the longitudinal direction of the plasma jet port 4B (the opening) to the plasma jet port 4B (in other words, symmetrically against the longitudinal center axis of the plasma jet port 4B). The shielding gas that is supplied at a certain flow rate from the gas supply apparatus 40B to a plurality of shielding gas jet ports 20 controlled by the control apparatus 43 is supplied for suppressing mixture of gas that is unnecessary or adverse to processing, e.g., oxygen or carbon dioxide in the air, into the plasma emission plane. As the shielding gas, $N_2$ gas or the like is used. It is preferable that the shielding gas jet ports 20 are disposed, for example, such that a plurality of openings are disposed in parallel to the coil extending direction (see FIG. 9B), or one or more slit-shape opening is disposed in parallel to the coil extending direction.

With such a structure, the type of gas, the gas flow rate, and the like are appropriately adjusted for each of the plasma gas suitable for plasma generation and the sheath gas protecting the inner wall of the cylindrical chamber 7B or the wall surface of the insulating member (the coil case 16) storing therein the solenoid coil 9B. Thus, stable plasma processing is enabled. Further, by separately supplying the shielding gas from a plurality of shielding gas jet ports 20, it becomes possible to suppress mixture of gas that is unnecessary or adverse to processing, e.g., oxygen, or carbon dioxide in the air, into plasma emission plane.

With such a thermal plasma processing apparatus, during procedures of: supplying $Ar+H_2$ gas from the sheath gas jet ports 18, Ar gas from the plasma gas jet ports 19, and $N_2$ gas from the shield gas jet port 20 each at a certain flow rate into the cylindrical chamber 7B; and jetting out the gas from the plasma jet port 4 toward the base material 2, high frequency power of 13.56 MHz is supplied to the solenoid coil 9B from the high frequency power supply 41. By operating in this manner, plasma P is generated in the cylindrical chamber 7; the plasma P is emitted to the base material 2 from the plasma jet port 4; and the inductively coupled plasma torch unit 3B is scanned relative to the base material 2. Thus, heat treatment such as crystallization of the semiconductor film can be performed.

The third embodiment is advantageous in that, since the solenoid coil 9B couples with plasma at the position in close proximity to the plasma, it is excellent in power efficiency. Further, since the solenoid coil 9B is stored in the coil case 16, the plasma P and the solenoid coil 9B are not brought into contact with each other. Therefore, copper is scarcely mixed into the plasma P and arc discharge occurs very little.

Further, the vertical cross section of the space 45 inside the cylindrical chamber 7B in the cross section of the cylindrical chamber 7B (FIG. 8) taken along a plane perpendicular to the center axis 10B of the solenoid coil 9B is U-shaped. Thus, the gas flow from the gas jet ports 18 and 19 toward the base material placement table 1 becomes extremely smooth; the laminarization is easily achieved; and extremely stable plasma processing is enabled.

Fourth Embodiment

In the following, with reference to FIGS. 9A to 10B, a description will be given of a fourth embodiment of the present invention.

Figure 9A:
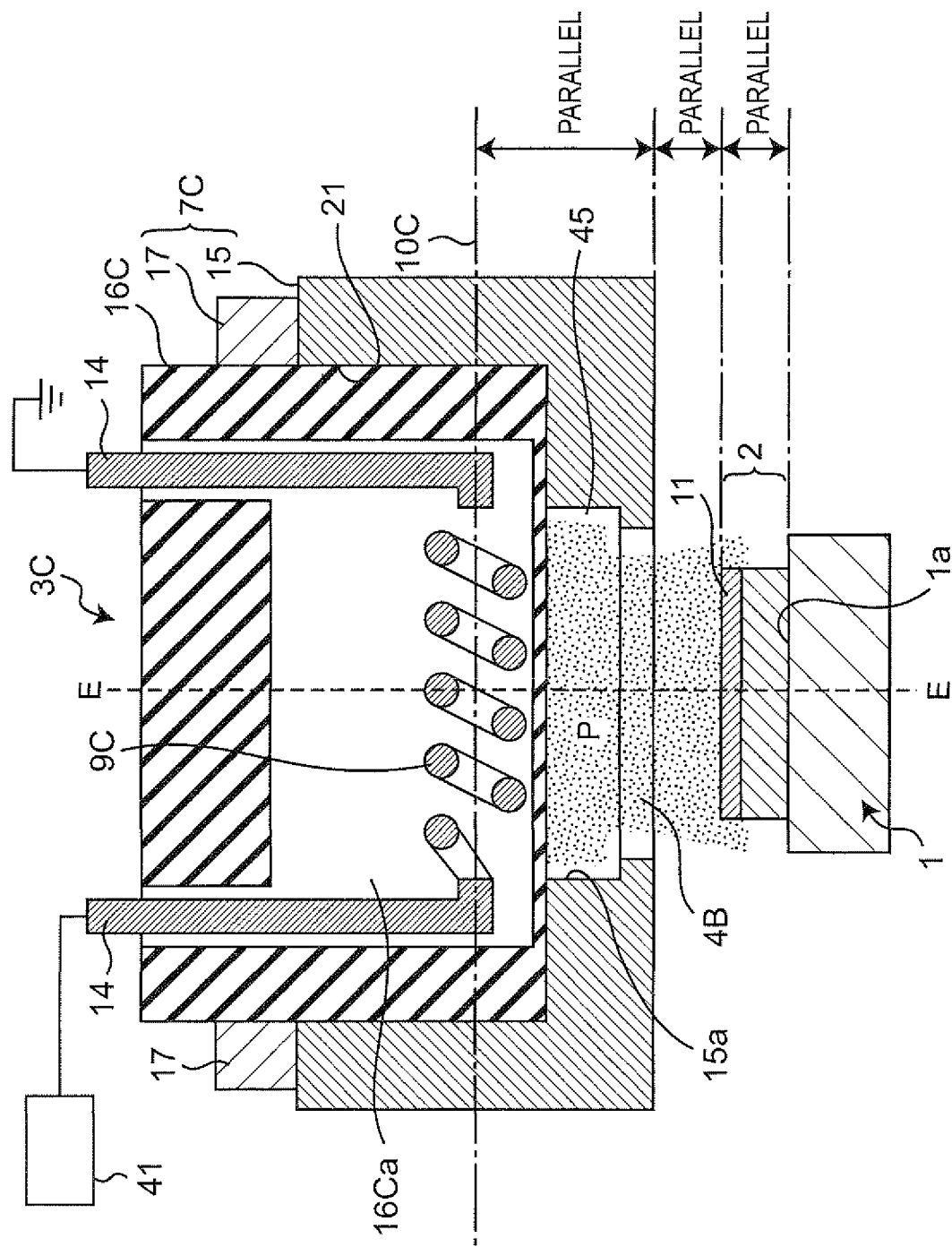
FIG. 9A is a cross-sectional view showing the structure of a plasma processing apparatus according to a fourth embodiment of the present invention.
Figure 9B:
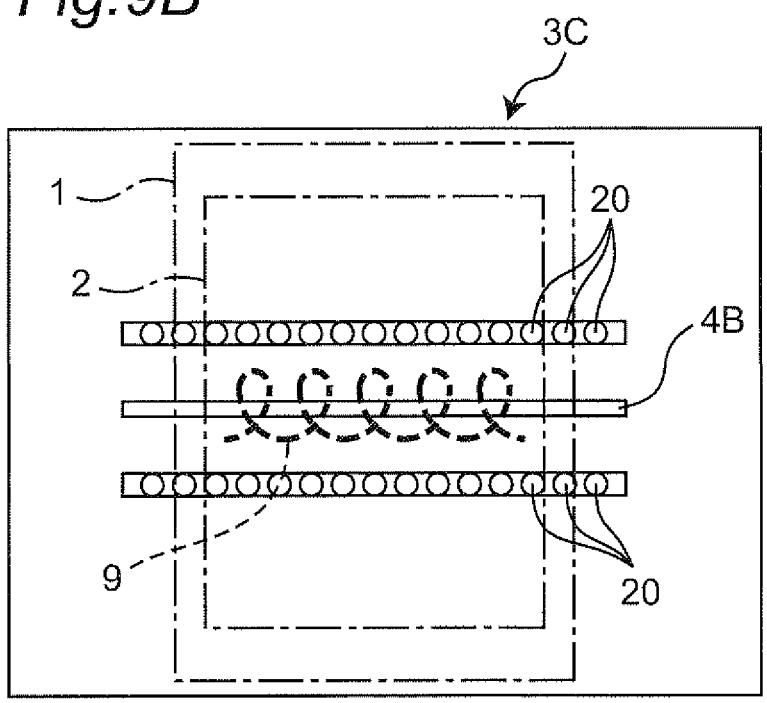
FIG. 9B is a bottom view of the plasma processing apparatus showing the relationship among the plasma processing apparatus according to the fourth embodiment of the present invention shown in FIG. 9A, a base material, and a base material placement table.
Figure 10A:
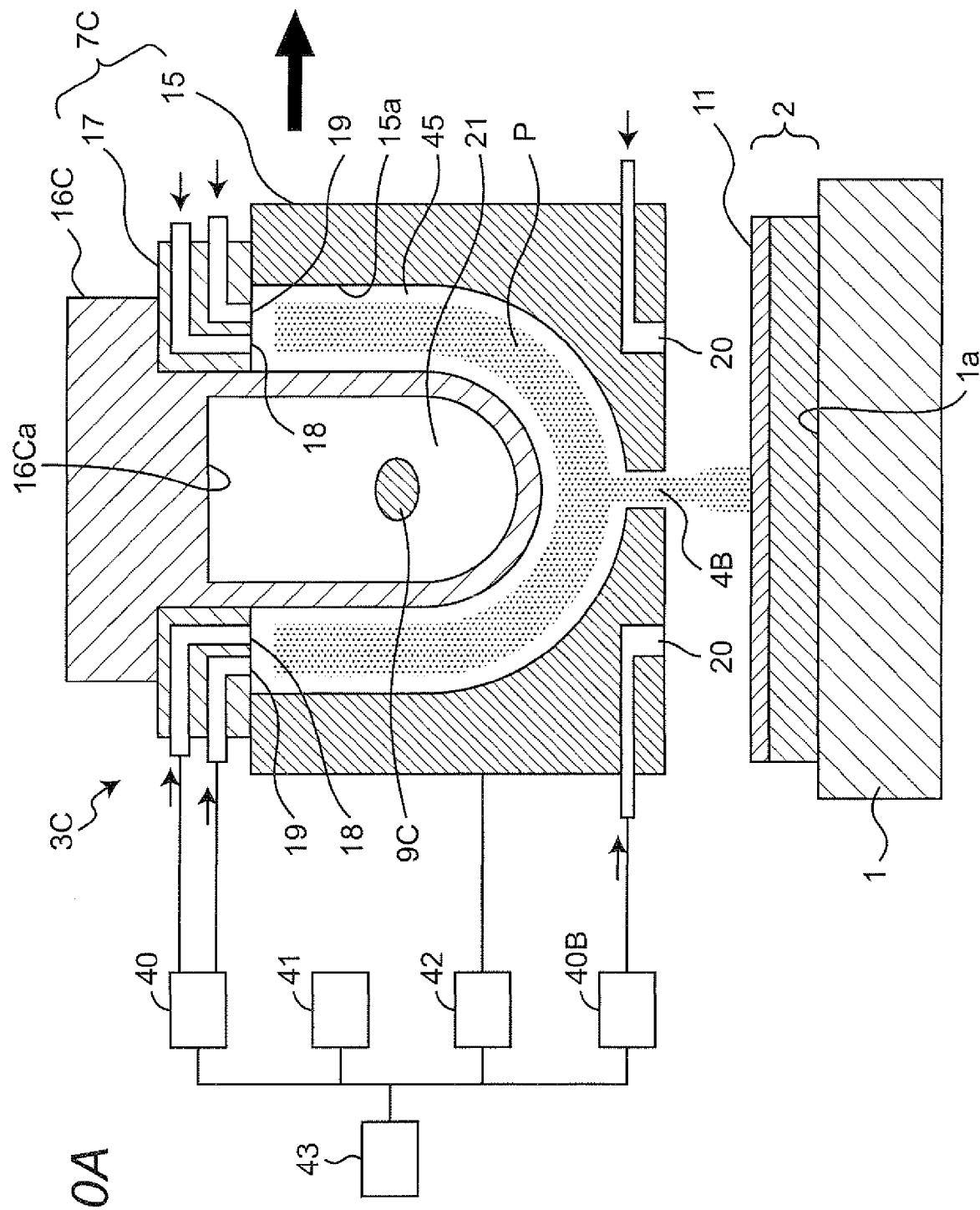
FIG. 10A is a cross-sectional end view taken along line E-E shown in FIG. 9A, showing the structure of the plasma processing apparatus according to the fourth embodiment of the present invention.

FIG. 9A shows the structure of a thermal plasma processing apparatus according to the fourth embodiment of the present invention. FIG. 9A is a cross-sectional view taken along a plane parallel to the longer direction of an inductively coupled plasma torch unit 3C, the plane including a center axis 10C of a solenoid coil 9C, and being perpendicular to the base material. FIG. 9B is a bottom view of the plasma processing apparatus showing the relationship among the plasma processing apparatus according to the fourth embodiment of the present invention shown in FIG. 9A, the base material, and the base material placement table, showing the disposition of shielding gas jet ports. Further, FIG. 10A is a cross-sectional end view taken along dashed line E-E shown in FIG. 9A. FIG. 10B is a bottom view of the plasma processing apparatus showing the relationship among the plasma processing apparatus according to the fourth embodiment of the present invention shown in FIG. 9A, the base material, and the base material placement table, in which the shielding gas jet ports 20 are not shown and the disposition relationship between the sheath gas jet ports 18 and the plasma gas jet ports 19 is shown instead.

In FIGS. 9A and 10, a space 16Ca for storing the solenoid coil 9C is in the coil case 16, and the space 16Ca is filled with insulating fluid 21. Hence, by immersing the solenoid coil 9C in the insulating fluid 21 and circulating the insulating fluid 21 by a chiller to flow inside the coil case 16C, the solenoid coil 9C and the coil case 16C are cooled.

With such a structure, both the solenoid coil 9C and the coil case 16C as an insulating member storing the solenoid coil 9C can effectively be cooled. Further, since it is not necessary to use a tubular pipe as the solenoid coil 9C, is advantageous in formability. As the insulating fluid 21, tap water, pure water, regenerated water, insulating oil, or the like can be used.

It is to be noted that, since the rest of the structure is identical to that in the third embodiment, identical reference characters are allotted and the description thereof is not repeated herein.

Fifth Embodiment

In the following, with reference to FIGS. 11 to 12, a description will be given of a fifth embodiment of the present invention.

Figure 12:
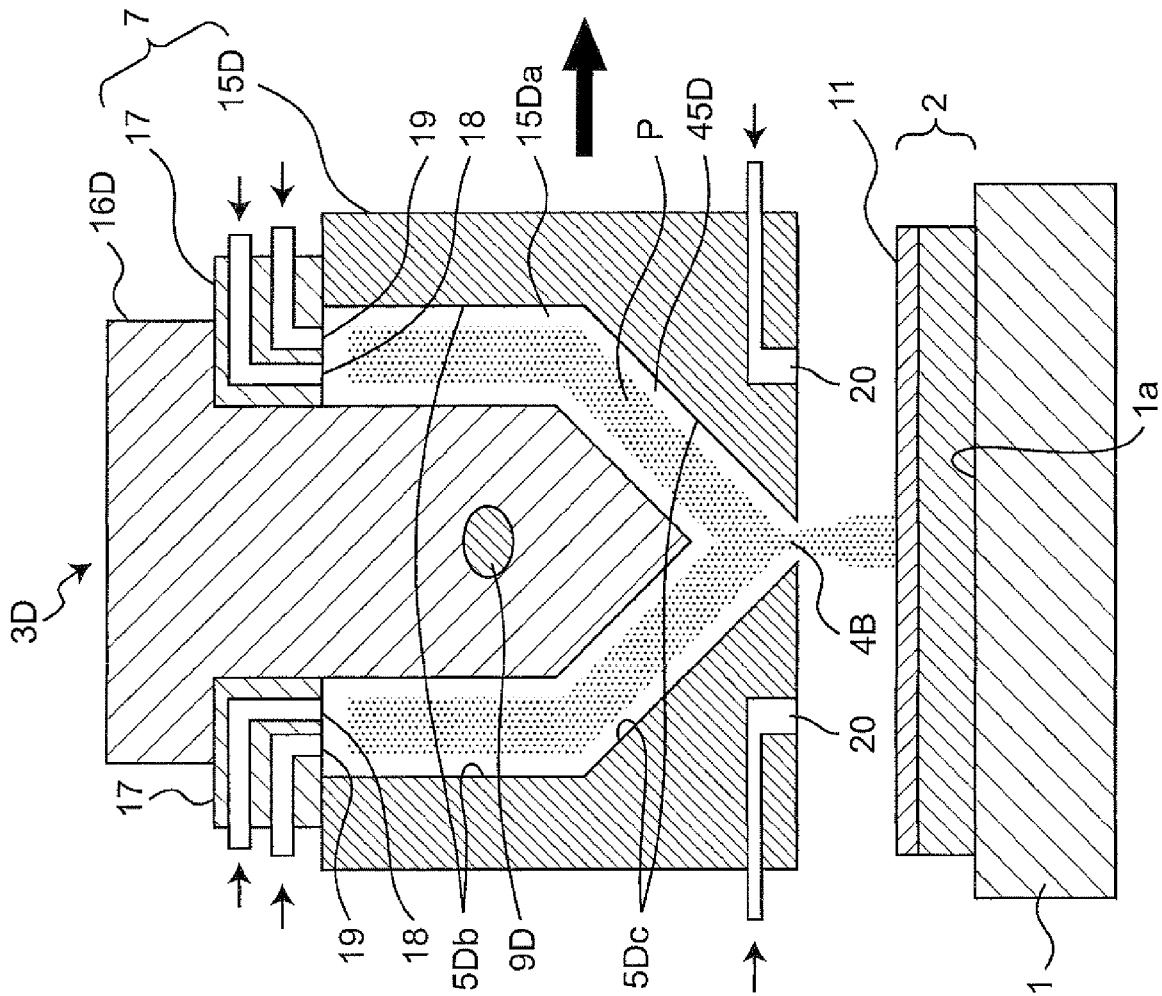
FIG. 12 is a cross-sectional view showing the structure of the plasma processing apparatus according to the fifth embodiment of the present invention.

FIGS. 11 and 12 each show the structure of a thermal plasma processing apparatus according to the fifth embodiment of the present invention. These figures are each a cross-sectional end view taken along a plane perpendicular to the center axis of a solenoid coil 9D. The cross-sectional end view taken along a plane parallel to the longer direction of the inductively coupled plasma torch unit 3D, the plane including the center axis of the solenoid coil 9D, and being perpendicular to the base material 2, is identical to FIG. 7 according to the third embodiment. FIGS. 11 and 12 are each a cross-sectional end view taken along dashed line D-D shown in FIG. 7.

In FIG. 11, a base block 15D is structured with a quadrangular prism-like metal material (e.g., brass) that is provided with a concave portion 15Da that opens at its upper surface and being greatly recessed downward. As seen in the vertical cross section, the inner shape of the concave portion 15Da of the base block 15D is structured with a pair of sidewalls 15Db which is downwardly linear from the upper portion to the center portion, and a pair of tilt surfaces 15Dc that becomes narrower from the center portion to the lower end as it approaches a slit-like plasma jet port 4B disposed at the center of the lower end face.

While the inner cross section of the base block 15 is arc-shaped in the third embodiment, as shown in FIGS. 11 and 12, the base block 15 according to the fifth embodiment is structured to be triangular with the pair of sidewalls 15Db which is downwardly linear from the upper portion to the center portion, and the pair of tilt surfaces 15Dc that becomes narrower from the center portion to the lower end as it approaches the slit-like plasma jet port 4B disposed at the center of the lower end face. Such a structure allows the gas flow from the gas jet ports 18 and 19 toward the base material placement table 1 to become further smooth, while the laminarization is easily achieved and extremely stable plasma processing is enabled. It is to be noted that, since the rest of the structure is identical to that of the third embodiment, identical reference characters are allotted and the description thereof is not repeated herein. Further, since the apparatuses such as the control apparatus 43 are identical to those according to the third embodiment, the description thereof will not be repeated and not shown.

Further, in FIG. 12, the inner shape of the base block 15 structured with a metal material is formed to become narrower as it approaches the slit-like plasma jet port 4, as described above. In addition, the outer shape of the coil case 16D is also structured to become narrower as it approaches the plasma jet port 4, by being formed in a downward convex shape and its tip being triangular. While the outer shape cross section of the coil case 16 is arc-shaped in the third embodiment, it is triangular in the fifth embodiment as shown in FIG. 12. With such a structure, the lower portion of the space 45D formed between the bottom face of the concave portion 15Da of the base block 15 and the coil case 16D forms a V-shaped cross section, whereby the gas flow from the gas jet ports 18 and toward the base material placement table 1 becomes further smooth. Thus, the laminarization is easily achieved and extremely stable plasma processing is enabled. With this structure, instead of employing the solenoid coil 9D of a cylinder-like spiral shape, a triangular prism spiral shape can be employed.

Since the rest of the structure is identical to that of the third embodiment, the description thereof will not be repeated.

Sixth Embodiment

In the following, with reference to FIG. 13, a description will be given of a sixth embodiment of the present invention. It is to be noted that, in the sixth embodiment, since the relationship among the control apparatus 43, the gas supply apparatus 40, the high frequency power supply 41, the shifting apparatus 42 and the like is identical to the foregoing embodiments, they are not shown in the figure.

Figure 13:
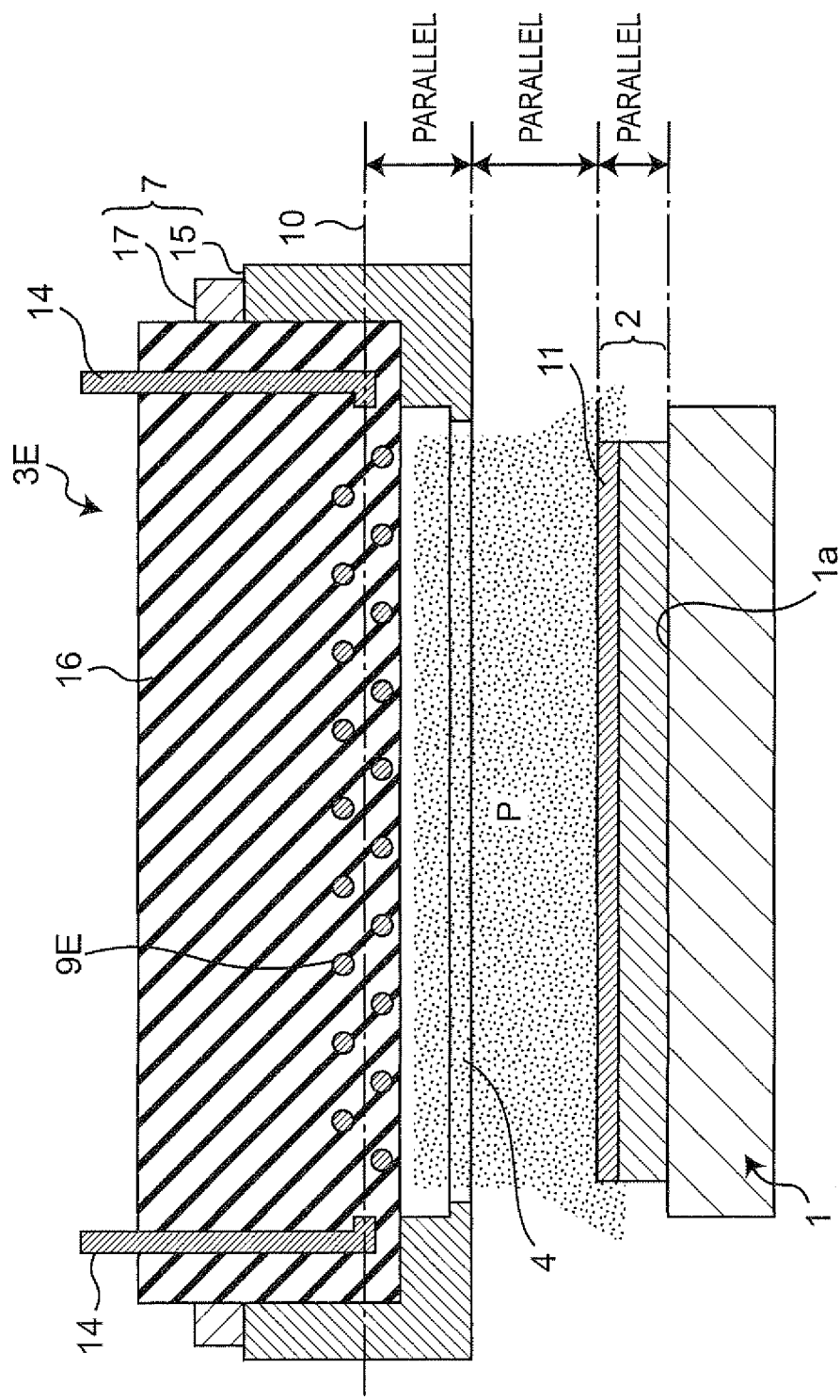
FIG. 13 is a cross-sectional view showing the structure of a plasma processing apparatus according to a sixth embodiment of the present invention.

FIG. 13 shows the structure of a thermal plasma processing apparatus according to the sixth embodiment of the present invention. FIG. 13 is a cross-sectional view taken along a plane parallel to the longer direction of the inductively coupled plasma torch unit 3E, the plane including a center axis 10 of a solenoid coil 9E and being perpendicular to the base material 2.

FIG. 13 shows the structure of the thermal plasma processing apparatus in the case in which the width of the base material 2 to be processed is great (e.g., the width or the diameter is 100 mm or more). The difference from the third embodiment shown in FIG. 7 is that the inductively coupled plasma torch unit 3E is greater in the longer direction, and the length of the solenoid coil 9E is greater as well. Further, the number of turns of the solenoid coil 9E is greater as well. It is to be noted that, since the rest of the structure is identical to that in the third embodiment, the description thereof will not be repeated.

Seventh Embodiment

In the following, with reference to FIG. 14, a description will be given of a seventh embodiment of the present invention. It is to be noted that, in the seventh embodiment, since the relationship among the control apparatus 43, the gas supply apparatus 40, the high frequency power supply 41, the shifting apparatus 42 and the like is identical to the foregoing embodiments, they are not shown in the drawing.

Figure 14:
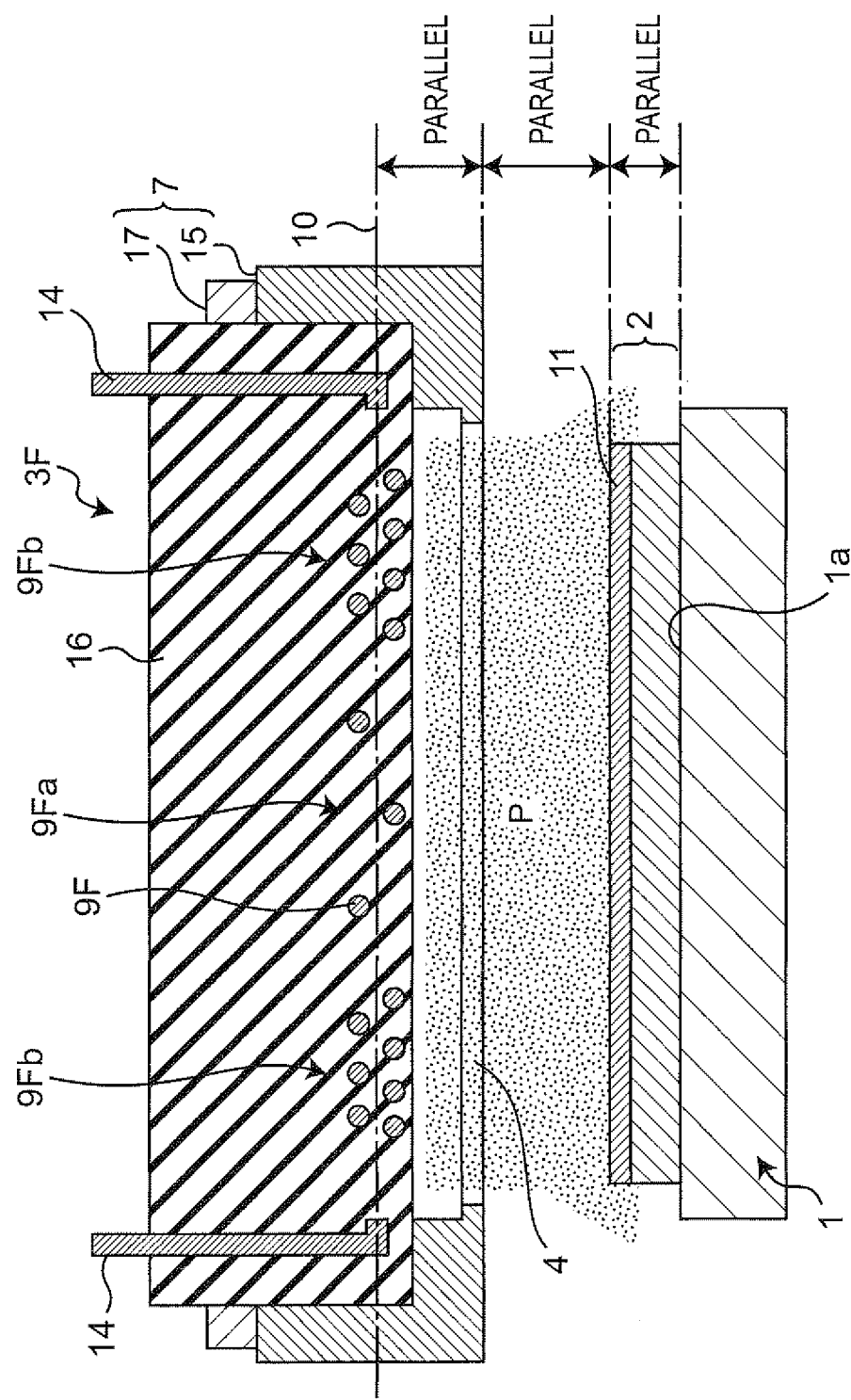
FIG. 14 is a cross-sectional view showing the structure of a plasma processing apparatus according to a seventh embodiment of the present invention.
Figure 17:
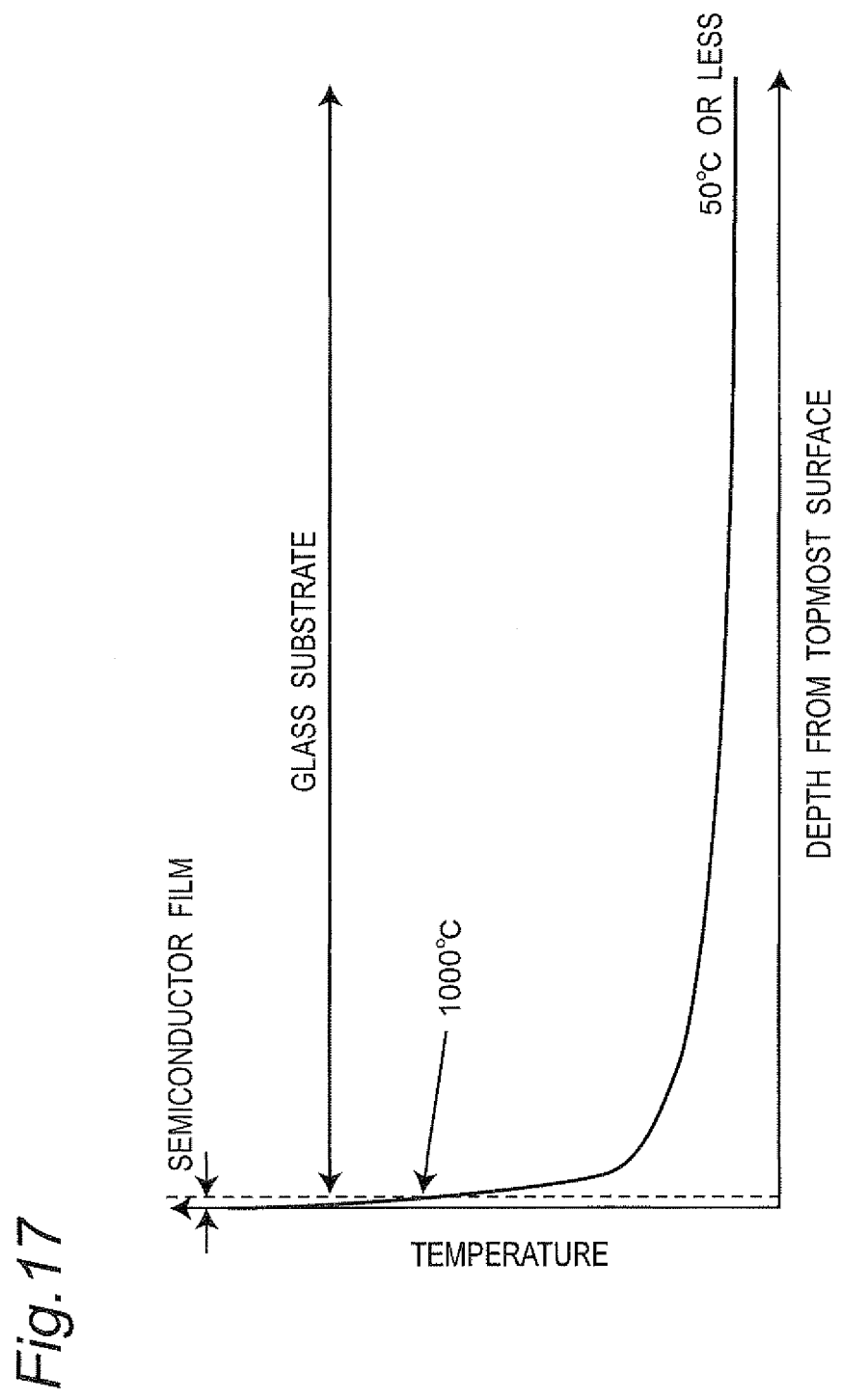
FIG. 17 is a conceptual view showing the relationship between the depth from the topmost surface and the temperature in the conventional example.

FIG. 14 shows the structure of a thermal plasma processing apparatus according to the seventh embodiment of the present invention. FIG. 14 is a cross-sectional view taken along a plane parallel to the longer direction of an inductively coupled plasma torch unit 3F, the plane including the center axis 10 of a solenoid coil 9F and being perpendicular to the base material 2.

FIG. 14 shows the structure of the thermal plasma processing apparatus in the case in which the width of the base material 2 to be processed is great (e.g., the width or the diameter is 100 mm or more). The difference from the sixth embodiment shown in FIG. 13 lies in the winding manner of the solenoid coil 9F. In the seventh embodiment, as compared to the number of turns of the center portion 9Fa of the solenoid coil 9F per unit length, the number of turns of the opposite end portions 9Fb per unit length is greater. That is, the number of turns of the solenoid coil 9F per unit length is caused to be non-uniform by design in the longitudinal direction of the solenoid coil 9F. In other words, in connection with the number of turns of the solenoid coil 9F per unit length, it is structured such that the opposite end portions 9Fb of the solenoid coil 9F become tighter than the center portion 9Fa.

Owing to its structure, with the torch unit 3F, the plasma density in the cylindrical chamber 7 tends to become lower at the opposite end portions in the longitudinal direction. This is because of plasma being lost into the inner wall surface of the base block 15 at the opposite end portions. Accordingly, in the seventh embodiment, by winding the solenoid coil 9F such that the opposite end portions 9Fb of the solenoid coil 9F become more tighter than the center portion 9Fa, the plasma generation amount at the opposite end portions is enhanced. Thus, uniformity of processing in the longitudinal direction is improved.

How to wind the solenoid coil 9F (i.e., how to provide non-uniformity to the number of turns per unit length in the longitudinal direction) can appropriately be selected depending on the size of the cylindrical chamber 7, the type of employed gas, and the like. It is to be noted that, since the rest of the structure is identical to that in the sixth embodiment, the description thereof will not be repeated.

Eighth Embodiment

In the following, with reference to FIG. 15A, a description will be given of an eighth embodiment of the present invention.

FIG. 15A shows the structure of a thermal plasma processing apparatus according to the eighth embodiment of the present invention. FIG. 15A is a cross-sectional view taken along a plane parallel to the longer direction of the inductively coupled plasma torch unit 3G, the plane including the center axis 10 of solenoid coils 22, 23, and 24, the plane being perpendicular to the base material 2.

FIG. 15A shows the structure of a thermal plasma processing apparatus in the case in which the width of the base material 2 to be processed is great (e.g., the width or diameter is 100 mm or more). The difference from the sixth embodiment shown in FIG. 13 lies in that a torch unit 3G is structured with three solenoid coils 22, 23, and 24. That is, the solenoid coils 22, 23, and 24 as being divided in a plurality of pieces in the longitudinal direction are used. The solenoid coils 22 to 24 are controlled by separate high frequency power supplies 41a, 41b, and 41c, whereby the plasma density distribution in the cylindrical chamber 7 can be controlled in the longitudinal direction. It is to be noted that, in this case also, in connection with the number of turns of the solenoid coil per unit length, as shown in FIG. 14, it is possible to structure such that the solenoid coils 22 and 24 at the opposite end portions become tighter than the solenoid coil 23 at the center portion.

It is also possible to combine the solenoid coils 22 to 24 differing in length from one another; to set the number of the solenoid coils to arbitrary number other than 3; to connect a plurality of solenoid coils in series or in parallel and to drive them with one high frequency power supply 41, and the like. It is to be noted that, since the rest of the structure is identical to that in the sixth embodiment, the description thereof will not be repeated.

Ninth Embodiment

In the following, with reference to FIG. 18, a description will be given of ninth embodiment of the present invention.

Figure 18:
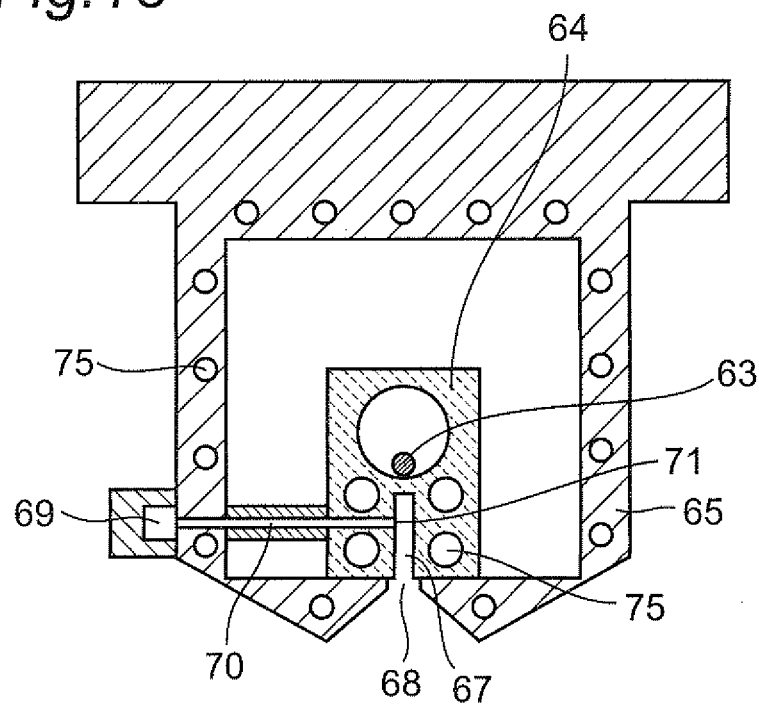
FIG. 18 is a cross-sectional view showing the structure of a plasma processing apparatus according to a ninth embodiment of the present invention.
Figure 19A:
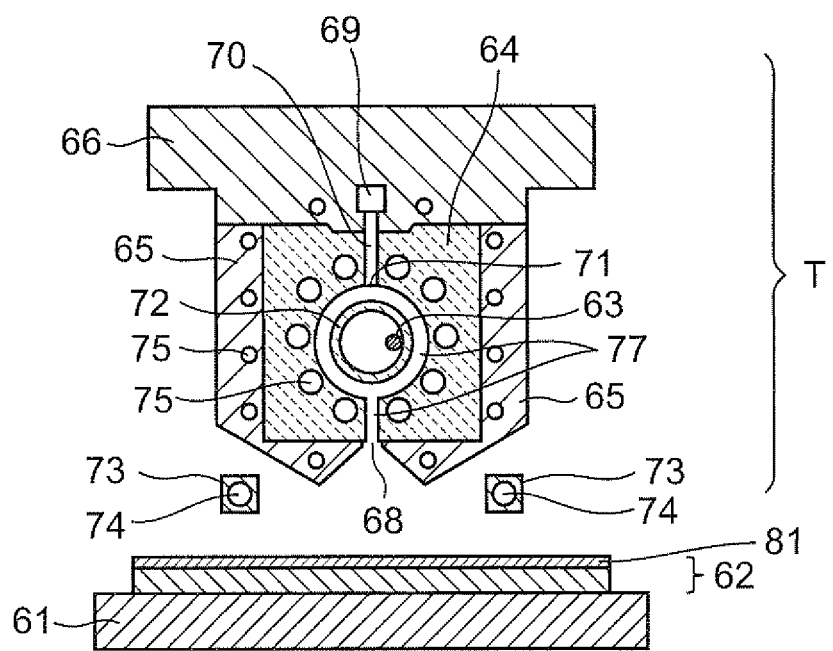
FIG. 19A is a cross-sectional view showing the structure of a plasma processing apparatus according to a first variation of the embodiment of the present invention.
Figure 19B:
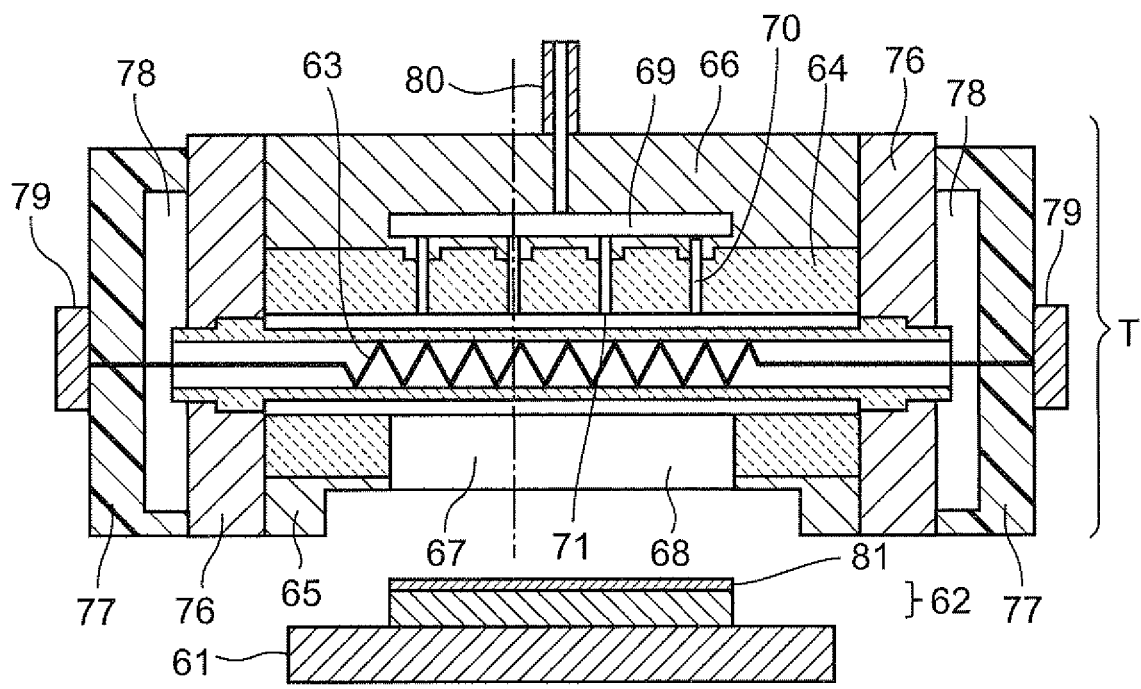
FIG. 19B is a cross-sectional view showing the structure of the plasma processing apparatus according to the first variation of the embodiment of the present invention.
Figure 20:
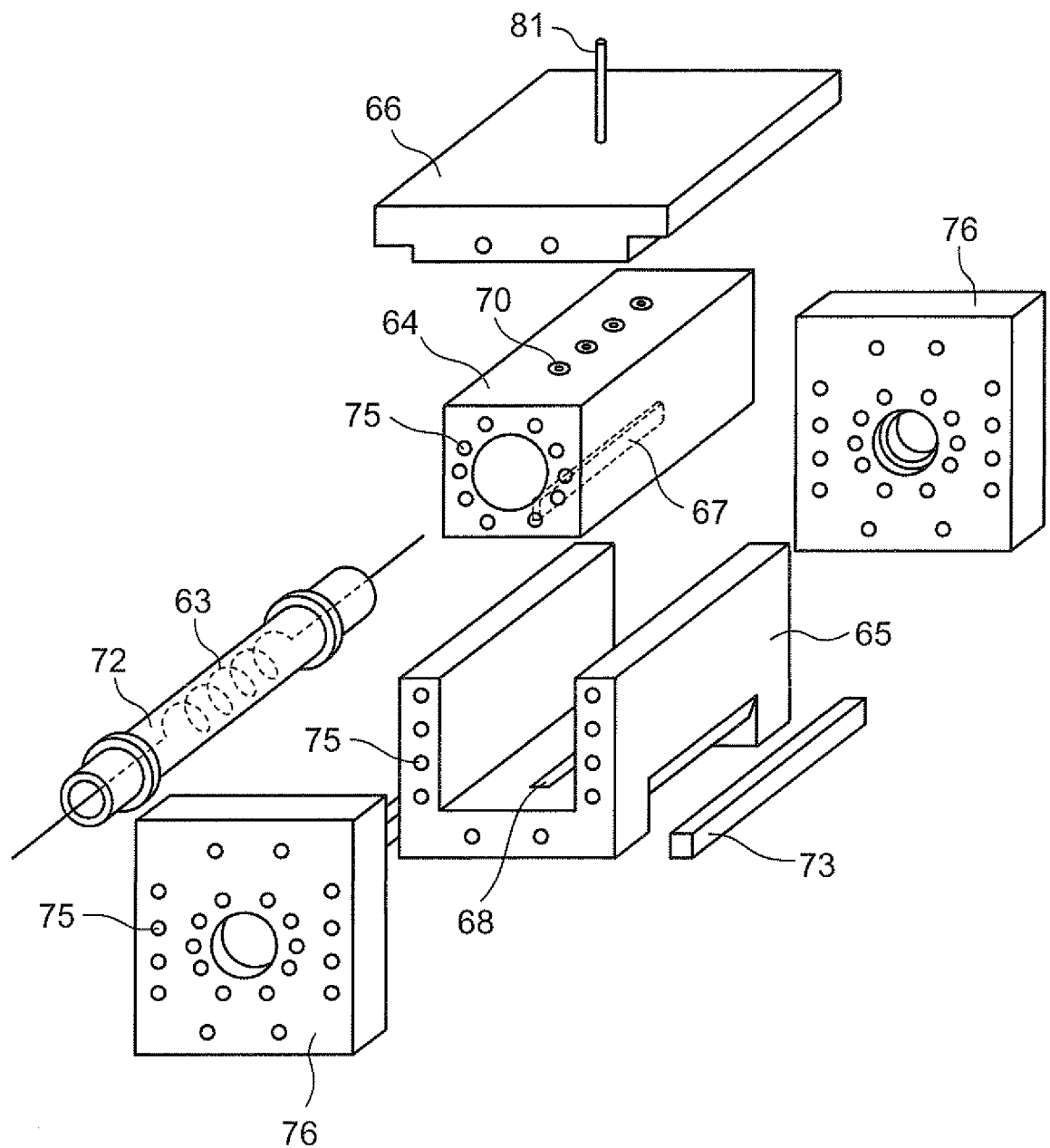
FIG. 20 is a perspective view showing the structure of the plasma processing apparatus according to the first variation of the embodiment of the present invention.
Figure 21:
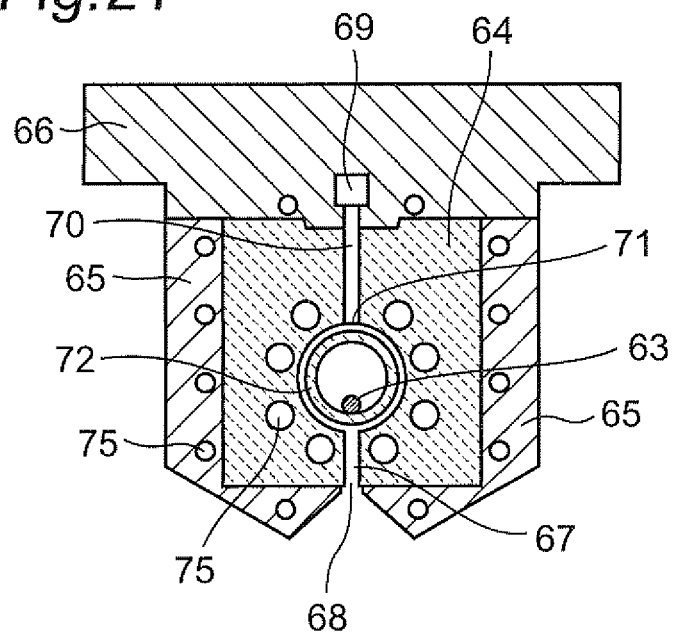
FIG. 21 is a cross-sectional view showing the structure of a plasma processing apparatus according to a second variation of the embodiment of the present invention.
Figure 22:
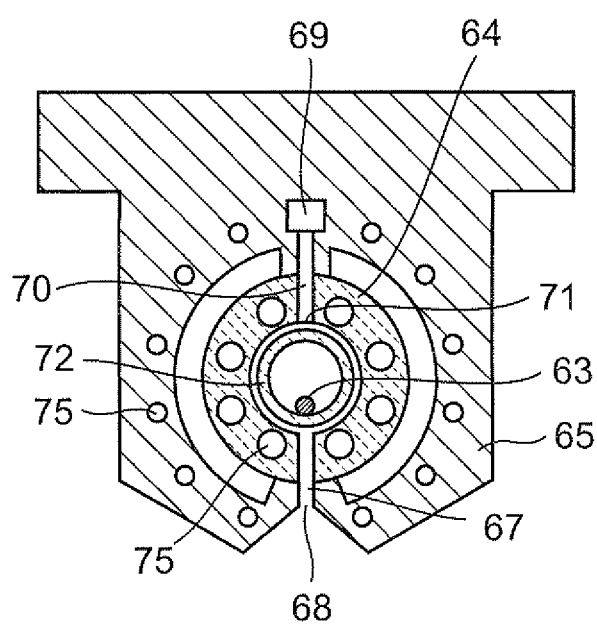
FIG. 22 is a cross-sectional view showing the structure of a plasma processing apparatus according to a third variation of the embodiment of the present invention.
Figure 23:
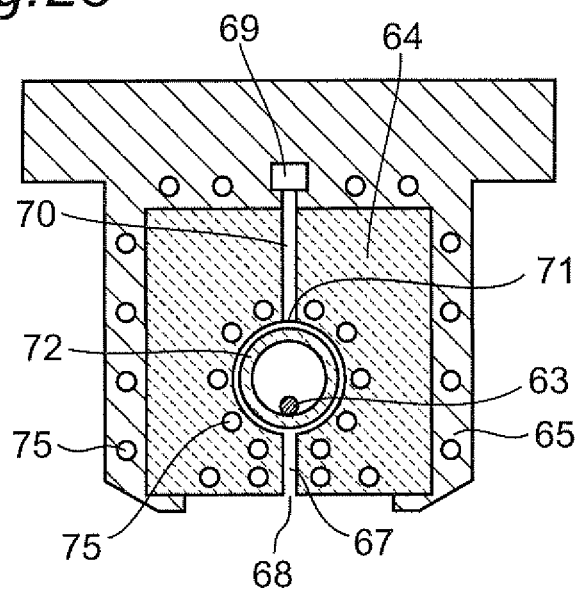
FIG. 23 is a perspective view showing the structure of a plasma processing apparatus according to a fourth variation of the embodiment of the present invention.
Figure 24:
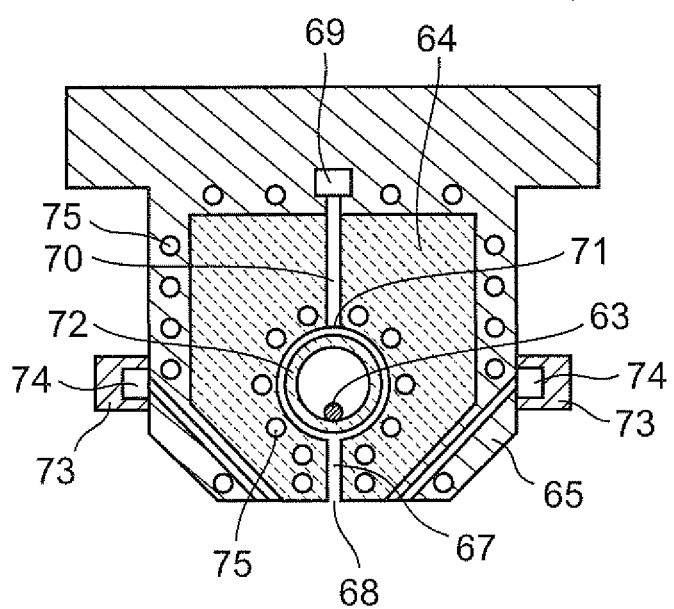
FIG. 24 is a cross-sectional view showing the structure of a plasma processing apparatus according to a fifth variation of the embodiment of the present invention.
Figure 25:
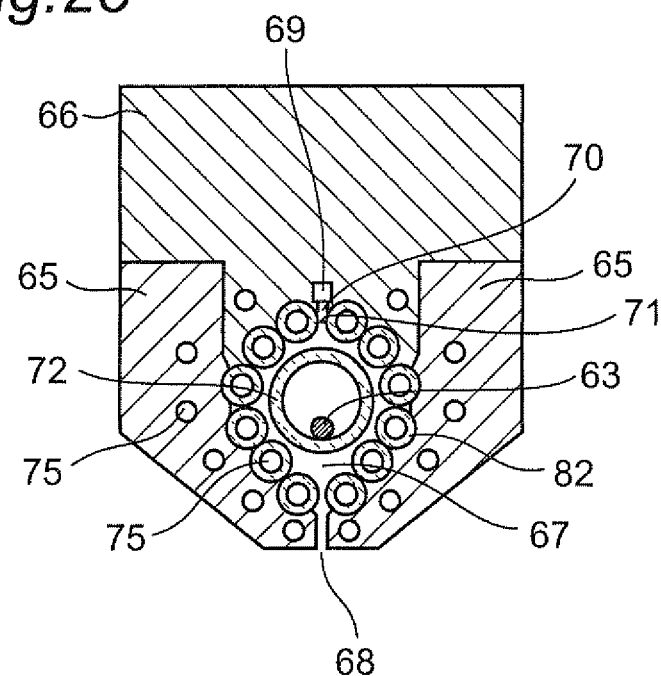
FIG. 25 is a perspective view showing the structure of a plasma processing apparatus according to a sixth variation of the embodiment of the present invention.
Figure 26:
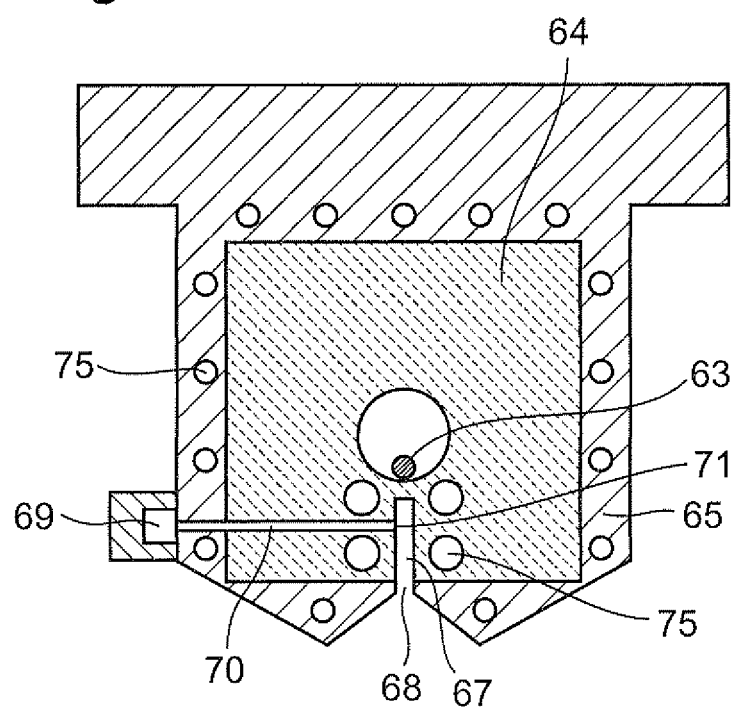
FIG. 26 is a cross-sectional view showing the structure of a plasma processing apparatus according to a seventh variation of the embodiment of the present invention.

FIG. 18 shows the structure of a plasma processing apparatus according to the ninth embodiment of the present invention. FIG. 18 is a cross-sectional view taken along a plane perpendicular to the longer direction of the inductively coupled plasma torch unit T, corresponding to FIG. 19A.

In FIG. 18, a quartz block 64 is provided with an elongated hole disposed in parallel to the elongated chamber and surrounded by the dielectric material. In the chamber, an elongated solenoid coil 63 is stored. The plasma gas is supplied from the plasma gas manifold 69 to a space 67 inside the elongated chamber from the side of the torch unit T through a plasma gas supply piping 70 and a plasma gas supply hole 71 penetrating through the brass block 65 and the quartz block 64. Further, the quartz block 64 is stored in the brass block 65 as a grounded conductor case having the air layer interposed therebetween.

With such a structure, the number of quartz-made components can be reduced, and a plasma processing apparatus of simple structure can be realized. Further, it becomes possible to effectively avoid abnormal discharge that may be caused by intrusion of inert gas such as Ar into the gap between the quartz block 64 and the brass block 65 or the brass lid 66. In order to more surely suppress residence of the inert gas such as Ar, it is also effective to provide a hole that establishes communication between the air layer and the space outside the torch unit, or to use a fan or the like to promote exchange of gas between the air layer and the space outside the torch unit.

It is to be noted that, though the description has been given on the basis that the atmosphere of the space outside the torch unit is air, the similar effect can be achieved even when the atmosphere of the space outside the torch unit is the gas which is inert and whose discharge start voltage under the atmospheric pressure is high, e.g., $N_2$. Alternatively, it is also effective to supply air or $N_2$ to the air layer using a flow rate control device, to avoid residence of inert gas such as Ar.

Further, the ninth embodiment is also advantageous in that a reduction in the weight of the quartz block 64 can be achieved, and hence a reduction in the weight of the inductively coupled plasma torch unit T can be achieved.

It is to be noted that, the plasma gas supply hole 71 may be a slit-like gas outlet that is parallel to the plasma jet port 68, or it may be a multitude of hole-like gas outlets disposed in parallel to the plasma jet port 68.

FIGS. 19A to 26 show various variations of the foregoing embodiments, in which 61 denotes the base material placement table, 62 denoting the base material, 66 denoting the brass lid, 72 denoting the quartz pipe, 73 denoting the shielding gas nozzle, 74 denoting the shielding gas manifold, 75 denoting the cooling water piping, 76 denoting the brass block, 77 denoting the resin case, 78 denoting the cooling water manifold, 79 denoting the copper block, 80 denoting the plasma gas supply tube, 81 denoting the thin film, and 82 denoting the quartz pipe.

Further, it may be structured such that the plasma gas supply piping 70 is surrounded by a grounded conductor. In the case in which the plasma gas supply piping 70 is made of a dielectric material, high frequency electromagnetic field is emitted inside the piping, which may invite undesirable discharge inside the piping. By employing the structure in which the plasma gas supply piping 70 is surrounded by the grounded conductor, such undesirable discharge can effectively be suppressed.

The thermal plasma processing apparatuses described in the foregoing are merely representative examples which fall within the application range of the present invention.

A variety of structures of the present invention makes it possible to subject the proximity of the surface of the base material 2 to high-temperature heat treatment. It is naturally applicable to crystallization of a semiconductor film for TFT or to improve the quality of a semiconductor film for solar cells having been detailed in connection with the conventional examples. Additionally, it can also be applied to a variety of surface processing, such as cleaning or reducing degassing of the protection layer of a plasma display panel, surface planarization or reducing degassing of a dielectric material layer made up of an aggregate of silica particulates, a reflow process of a variety of electronic devices, plasma doping using a solid impurity source, and the like. Further, the present invention is also applicable to a method for obtaining a polycrystalline silicon film in connection with a solar cell manufacturing method, including the steps of grinding a silicon ingot to obtain powder, applying the powder onto a base material, and emitting plasma thereto to melt the powder.

Further, though what have exemplarily been shown are the cases in which the plasma torch unit 3, 3A, 3B, or T is scanned relative to the fixed base material placement table 1 or 61, it is also possible to the case in which shifting apparatus performs scanning with the base material placement table 1 or 61 relative to the fixed plasma torch unit 3, 3A, 3B, or T.

Further, as shown in FIG. 15B, the spiral solenoid coils 9, 9A to 9F, 22 to 24 may each be a multiplex spiral coil 9H such as disclosed in Japanese Unexamined Patent Publication No. 8-83696. With such a structure, a reduction in inductance of the solenoid coil and an improvement in power efficiency can be achieved. This is particularly effective when the width of the base material 2 to be processed is great, that is, when the inductively coupled plasma torch unit or the solenoid coil is great in the longer direction.

Further, when gas is supplied from the gas supply apparatus 40, 40B to the gas jet port 18, 19, 20, the gas may be supplied through a manifold in order to supply gas uniformly from a plurality of openings of the gas jet ports 18, 19, and 20.

Further, as shown in FIG. 9B or 10B, in parallel to the coil extending direction, the gas jet ports 18, 19, and 20 may be disposed in a manner of a plurality of dot-like openings being disposed. Alternatively, a linear (slit-like) opening may be disposed in parallel to the coil extending direction.

Further, though the structure in which the parts made of a metal material are used has exemplarily been shown, it is also possible to coat a part of the parts made of a metal material that is brought into contact with the inner wall of the cylindrical chamber 7 by an insulating material. This makes it possible to prevent the metal material from mixing into plasma, and to suppress arc discharge.

Further, in order to facilitate plasma ignition, an ignition source can be used. As such an ignition source, an ignition spark apparatus that is used for a gas hot-water supply system can be used.

Still further, though the term "thermal plasma" is used for sake of simplicity in the present Description, it is difficult to strictly distinguish between thermal plasma and low-temperature plasma. Additionally, as explained for example in Non-Patent Literature (Yasunori TANAKA et al, "Non-Equilibria in Thermal Plasmas" Journal of Plasma and Fusion Research, Vol. 82, No. 8 (2006) pp. 479-483), it is difficult to distinguish the type of plasma simply based on thermal equilibrium. An object of the present invention is to subject the base material 2 to heat treatment. Therefore, the present invention can be applied to the technique related to emission of high-temperature plasma without being bound by the terms such as thermal plasma, thermal equilibrium plasma, high-temperature plasma, and the like.

Still further, though the cases in which the proximity of the surface of the base material 2 is subjected to high-temperature heat treatment just for a short time have exemplarily been described in detail, the present invention is also applicable to the case in which the plasma of a reactant gas is, or plasma and a reactant gas flow are simultaneously emitted to the base material so as to subject the base material to low-temperature plasma processing. By mixing the reactant gas with the plasma gas or the sheath gas, the plasma of the reactant gas is emitted to the base material, and etching or CVD can be realized. Alternatively, it is also possible to employ noble gas or the gas obtained by adding a small amount of $H_2$ gas to noble gas as the plasma gas or the sheath gas, and to supply the gas including a reactant gas as the shielding gas, and then, the plasma and the reactant gas flow are simultaneously emitted to the base material. This realizes plasma processing such as etching, CVD, or doping. By using the gas whose main component is argon as the plasma gas or the sheath gas, thermal plasma is generated as has been described in detail in connection with the embodiments.

On the other hand, by using the gas whose main component is helium as the plasma gas or the sheath gas, plasma of relatively low temperature can be generated. Through such a method, processing such as etching or deposition can be realized without overheating the base material.

The reactant gas used for etching may include a halogen containing gas, e.g., $C_xF_y$ (x, y are natural number), $SF_6$, and the like, with which silicon or a silicon compound can be etched. Use of $O_2$ as the reactant gas realizes removal of organic substances, resist aching, and the like. The reactant gas used for CVD may include monosilane, disilane, and the like, with which silicon or a silicon compound can be deposited.

Alternatively, use of a mixture gas made up of an organic gas containing silicon, which is represented by TEOS (Tetraethoxysilane), and $O_2$ realizes deposition of a silicon oxide film. Further, a variety of low-temperature plasma processing, such as surface modification treatment as to water repellency or hydrophilicity, can be realized. As compared to the conventional techniques (e.g., disclosure of Patent Literature 7), since the present invention is of the inductively coupled type, arc discharge is less prone to occur even when high power density per unit volume is inputted. Therefore, high-density plasma can be generated. As a result, a fast reaction speed can be obtained, and the entire desired processing target region of the base material can be processed in a short time.

By properly combining the arbitrary embodiment(s) or variation(s) of the aforementioned various embodiments and variations, the effects possessed by the embodiment(s) or variation(s) can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

INDUSTRIAL APPLICABILITY

As has been described above, the plasma processing apparatus and the plasma processing method of the present invention can naturally be applied to crystallization of a semiconductor film for TFT or to modification of a semiconductor film for solar cells. In addition thereto, the present invention is useful in processing the entire desired processing target region of the base material in a short time, in subjecting the proximity of the surface of the base material to high-temperature heat treatment uniformly just for a short time in a variety of surface treatment, including: cleaning or reducing degassing of the protection layer of a plasma display panel; surface planarization or reducing degassing of a dielectric material layer structured with an aggregation of silica particulates; or reflow of a variety of electronic devices.

Further, the plasma processing apparatus and the plasma processing method of the present invention is useful in processing the entire desired processing target region of the base material in short time in performing low-temperature plasma processing such as etching, deposition, surface modification, or the like in manufacturing various electronic devices or the like.

The invention claimed is:
1. A plasma processing method, comprising:
while supplying gas into a cylindrical chamber and jetting out the gas from a slit-like opening formed at the chamber to a base material placed on a base material placement face of a base material placement table, supplying high frequency power to a solenoid coil having a coil extending direction being parallel to a longitudinal direction of the opening to generate a high frequency electromagnetic field in the chamber; and
while a state in which the longitudinal direction of the opening and the base material placement face of the base material placement table are parallel to each other is maintained, relatively shifting the chamber and the base material placement table and making a surface of the base material subjected to plasma treatment.
2. A plasma processing apparatus, comprising:
a cylindrical chamber that is provided with a slit-like opening;
a gas supply apparatus that supplies gas into the chamber through a gas inlet port;
a solenoid coil that has a coil extending direction being parallel to a longitudinal direction of the opening and that generates a high frequency electromagnetic field in the chamber;
a high frequency power supply that supplies high frequency power to the coil;
a base material placement table that is disposed to oppose to the opening and has a base material placement face on which a base material is placed; and a shifting apparatus that relatively shifts the chamber and the base material placement table while maintaining a state in which the longitudinal direction of the opening and the base material placement face of the base material placement table are parallel to each other.

3. The plasma processing apparatus according to claim 2, wherein the shifting apparatus relatively shifts the chamber and the base material placement table along a direction being perpendicular to the longitudinal direction of the opening.

4. The plasma processing apparatus according to claim 2, wherein the cylindrical chamber is structured with a cylinder made of a dielectric material, and the coil is provided on an outer side of the chamber.

5. The plasma processing apparatus according to claim 2, wherein the cylindrical chamber is structured with a cylinder made of metal, and the coil is provided on an inner side of the chamber.

6. The plasma processing apparatus according to claim 2, wherein a plurality of the gas inlet ports that supply gas from the gas supply apparatus to the chamber are provided in parallel to the longitudinal direction of the opening, and are provided at a plane opposing to the opening.

7. The plasma processing apparatus according to claim 2, wherein a linear portion of each of opposite end portions of the coil is bent in a direction perpendicular to the extending direction of the coil, the linear portion being lead out in a direction opposite to the opening of the cylindrical chamber, so as to be at an outer side of the chamber.

8. The plasma processing apparatus according to claim 2, wherein a space inside the chamber is annular in a cross-section of the chamber taken along a plane perpendicular to an extending direction of the coil.

9. The plasma processing apparatus according to claim 2, wherein a space inside the chamber is U-shaped in a cross-section of the chamber taken along a plane perpendicular to an extending direction of the coil.

10. The plasma processing apparatus according to claim 2, wherein the coil is stored in a space of a coil case made of an insulating member, the coil is immersed in an insulating fluid in the space, and the coil is cooled by the insulating fluid flowing in the space.

11. The plasma processing apparatus according to claim 2, wherein a supply system of the gas that supplies gas into the chamber from the gas supply apparatus via the gas inlet port is structured with at least two systems including a system for sheath gas and a system for plasma gas.

12. The plasma processing apparatus according to claim 2, wherein a number of turns of the coil per unit length is non-uniform in an extending direction of the coil.

13. The plasma processing apparatus according to claim 2, wherein the solenoid coil is structured as being divided into a plurality of pieces in an extending direction of the coil.

* * * * *